(12) United States Patent
Fujiwara et al.

(10) Patent No.: US 8,183,616 B2
(45) Date of Patent: May 22, 2012

(54) SEMICONDUCTOR DEVICE, RF-IC AND MANUFACTURING METHOD OF THE SAME

(75) Inventors: Tsuyoshi Fujiwara, Tokyo (JP); Toshinori Imai, Tokyo (JP); Takeshi Saikawa, Tokyo (JP); Yoshinori Kawasaki, Tokyo (JP); Mitsuhiro Toya, Tokyo (JP); Shunji Mori, Tokyo (JP); Yoshiyuki Okabe, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/873,668

(22) Filed: Sep. 1, 2010

(65) Prior Publication Data

US 2010/0320568 A1    Dec. 23, 2010

Related U.S. Application Data

(63) Continuation of application No. 12/565,963, filed on Sep. 24, 2009, now abandoned, which is a continuation of application No. 11/473,229, filed on Jun. 23, 2006, now abandoned.

(30) Foreign Application Priority Data

Jun. 27, 2005   (JP) ................. 2005-186967

(51) Int. Cl.
   *H01L 29/94* (2006.01)
(52) U.S. Cl. ........ 257/307; 257/306; 257/309; 257/532; 257/534; 257/535; 257/E29.343
(58) Field of Classification Search .......... 257/301, 257/303, 305, 306, 307, 309, 532, 534, 535, 257/E29.343
   See application file for complete search history.

(56) References Cited

U.S. PATENT DOCUMENTS

| 5,745,335 | A | | 4/1998 | Watt |
| 6,100,574 | A | * | 8/2000 | Norstrom et al. ............. 257/532 |
| 6,150,690 | A | * | 11/2000 | Ishibashi et al. ............. 257/306 |
| 6,175,131 | B1 | | 1/2001 | Adan |
| 6,411,494 | B1 | | 6/2002 | Watt |
| 6,436,756 | B1 | | 8/2002 | Nishimura et al. |
| 6,781,233 | B2 | | 8/2004 | Zverev et al. |
| 6,788,521 | B2 | | 9/2004 | Nishi |
| 6,831,323 | B2 | * | 12/2004 | Ito et al. ......................... 257/306 |
| 6,958,509 | B2 | * | 10/2005 | Korner et al. ................. 257/306 |

(Continued)

FOREIGN PATENT DOCUMENTS

JP     2001-102529 A    4/2001

(Continued)

*Primary Examiner* — Zandra Smith
*Assistant Examiner* — Eric Ward
(74) *Attorney, Agent, or Firm* — Mattingly & Malur, PC

(57) ABSTRACT

Provided is a technology capable of reducing parasitic capacitance of a capacitor while reducing the space occupied by the capacitor. A stacked structure is obtained by forming, over a capacitor composed of a lower electrode, a capacitor insulating film and an intermediate electrode, another capacitor composed of the intermediate electrode, another capacitor insulating film and an upper electrode. Since the intermediate electrode has a step difference, each of the distance between the intermediate electrode and lower electrode and the distance between the intermediate electrode and upper electrode in a region other than the capacitor formation region becomes greater than that in the capacitor formation region. For example, the lower electrode is brought into direct contact with the capacitor insulating film in the capacitor formation region, while the lower electrode is not brought into direct contact with the capacitor insulating film in the region other than the capacitor formation region.

10 Claims, 24 Drawing Sheets

U.S. PATENT DOCUMENTS

| | | |
|---|---|---|
| 7,154,341 B2 | 12/2006 | Yamamoto et al. |
| 7,170,355 B2 | 1/2007 | Lee et al. |
| 7,187,026 B2 | 3/2007 | Kiyotoshi |
| 7,342,292 B2 * | 3/2008 | Schrenk ................. 257/532 |
| 2003/0030093 A1 * | 2/2003 | Agarwal et al. ........... 257/306 |
| 2003/0124794 A1 * | 7/2003 | Girardie ................. 438/250 |
| 2003/0181017 A1 | 9/2003 | Mikawa et al. |
| 2003/0197215 A1 | 10/2003 | Coolbaugh et al. |
| 2004/0012044 A1 | 1/2004 | Hoshi |
| 2004/0137693 A1 | 7/2004 | Kim |
| 2005/0082592 A1 | 4/2005 | Chang et al. |
| 2005/0116276 A1 * | 6/2005 | Gau .................... 257/306 |
| 2005/0139886 A1 * | 6/2005 | Choi ................... 257/296 |
| 2005/0167722 A1 * | 8/2005 | Won .................... 257/303 |
| 2005/0221789 A1 | 10/2005 | Pan |
| 2006/0038217 A1 * | 2/2006 | Mikawa et al. ........... 257/306 |

FOREIGN PATENT DOCUMENTS

| | | |
|---|---|---|
| JP | 2003-218219 A | 7/2003 |

* cited by examiner

SEMICONDUCTOR DEVICE, RF-IC AND MANUFACTURING METHOD OF THE SAME

CROSS-REFERENCE TO RELATED APPLICATION

The present application is a continuation of U.S. patent application Ser. No. 12/565,963, filed Sep. 24, 2009 (now abandoned), which is a continuation of U.S. patent application Ser. No. 11/473,229, filed Jun. 23, 2006 (now abandoned), which claims priority from Japanese patent application No. 2005-186967 filed on Jun. 27, 2005, the content of which is hereby incorporated by reference into this application.

BACKGROUND OF THE INVENTION

The present invention relates to a semiconductor device, a transmitter-receiver device using it, and a manufacturing method of the semiconductor device, particularly to, a technology effective when applied to a semiconductor device requiring a reduction in the space occupied by a capacitor formed on a semiconductor chip.

A technology of reducing the space of a capacitor while maintaining adequate capacitance by changing the MIM (Metal Insulator Metal) structure of the capacitor to a stacked structure is disclosed (refer to, for example, Japanese Unexamined Patent Publication No. 2004-200640 and Japanese Unexamined Patent Publication No. Hei 10(1998)-326863).

In addition, DRAM (Dynamic Random Access Memory) having a structure in which capacitors with an electrode made of a polysilicon film have been stacked one after another and they have a lifted-up end is disclosed (for example, Japanese Unexamined Patent Publication No. Hei 10(1998)-107221).

SUMMARY OF THE INVENTION

In the above-described Japanese Unexamined Patent Publication No. 2004-200640 or Japanese Unexamined Patent Publication No. Hei 10(1998)-326863, a first capacitor is composed of a lower electrode, a first capacitor insulating film formed over the lower electrode and an intermediate electrode formed over the first capacitor insulating film. A second capacitor is composed of the intermediate electrode, a second capacitor insulating film formed over the intermediate electrode and an upper electrode formed over the second capacitor insulating film. Thus, the second capacitor is stacked over the first capacitor. The intermediate electrode is, at any portion thereof, in contact with the first capacitor insulating film so that the capacitance (interlayer capacitance) of the intermediate electrode is equal to the capacitance of the first capacitor.

There is a demand for the use of the intermediate electrode not only as the electrode of the first capacitor or the second capacitor but also as a signal interconnect or power supply interconnect. When it is used in the structure as described in the above-described Japanese Unexamined Patent Publication No. 2004-200640 or Japanese Unexamined Patent Publication No. Hei 10(1998)-326863, the parasitic capacitance due to the intermediate electrode becomes equal to that of the first capacitor so that use of it as a general interconnect inevitably increases signal delay or power consumption. This makes it substantially difficult to use the intermediate electrode as general interconnects. In particular, in a circuit operating at high frequencies requires high-speed operation so the intermediate electrode cannot be used as a general interconnect without reducing the parasitic capacitance between interconnects.

In Japanese Unexamined Patent Publication No. Hei 10(1998)-107221, described is use of a polysilicon film as an electrode of the capacitor of DRAM. A polysilicon film has a higher resistance than a metal film to be used for electrodes of an MIM structure. Moreover, in a capacitor using a polysilicon film, the distance between electrodes is usually made smaller than that of a capacitor using a metal film so that the parasitic capacitance becomes greater. Increase in signal delay or power consumption therefore occurs in the electrode using a polysilicon film compared with that using a metal film. This makes it difficult to use the electrode using a polysilicon film as a general interconnect. This document includes neither a description nor suggestion on a reduction in the parasitic capacitance.

An object of the present invention is to provide a technology capable of reducing the parasitic capacitance of a capacitor while reducing the space occupied by the capacitor.

The above-described and the other objects and novel features of the present invention will be apparent by the description herein and accompanying drawings.

Outline of typical inventions, of the inventions disclosed by the present application, will next be described briefly.

In the present invention, there is thus provided a semiconductor device comprising a first electrode made of a metal film, a first capacitor insulating film formed over the first electrode, a second electrode made of a metal film and formed over the first capacitor insulating film, a second capacitor insulating film formed over the second electrode, and a third electrode made of a metal film and formed over the second capacitor insulating film, wherein the first electrode includes a capacitor having a portion not in direct contact with the first capacitor insulating film.

In the present invention, there is also provided a transmitter-receiver device for transmitting or receiving electric waves, which comprises a first electrode made of a metal film, a first capacitor insulating film formed over the first electrode, a second electrode made of a metal film and formed over the first capacitor insulating film, a second capacitor insulating film formed over the second electrode, and a third electrode made of a metal film and formed over the second capacitor insulating film, wherein the first electrode includes a capacitor having a portion not in direct contact with the first capacitor insulating film.

In a further aspect of the present invention, there is also provided a manufacturing method of a semiconductor device, which comprises the steps of: (a) forming a first electrode over a semiconductor substrate, (b) forming a first insulating film over the first electrode, (c) forming, in the first insulating film, a first opening portion reaching the first electrode, (d) forming a first capacitor insulating film over the first insulating film including the inside of the first opening portion, (e) forming a first conductor film over the first capacitor insulating film including the inside of the first opening portion, (f) patterning the first conductor film to form the second electrode, (g) forming a second insulating film over the semiconductor substrate including the upper surface of the second electrode, (h) forming, in the second insulating film, a second opening portion reaching the second electrode, (i) forming a second capacitor insulating film over the second insulating film including the inside of the second opening portion, (j) forming a second conductor film over the second capacitor insulating film including the inside of the second opening portion, and (k) patterning the second conductor film to form a third electrode.

Advantages available by the typical inventions, among the inventions disclosed by the present application, will next be described briefly.

The present invention makes it possible to decrease the parasitic capacitance of a capacitor while reducing the space occupied by the capacitor by stacking plural capacitors one after another and at the same time, by equipping an electrode constituting each capacitor with a portion not in direct contact with a capacitor insulating film.

DETAILED DESCRIPTION OF THE PREFERRED EMBODIMENTS

Figure 1:
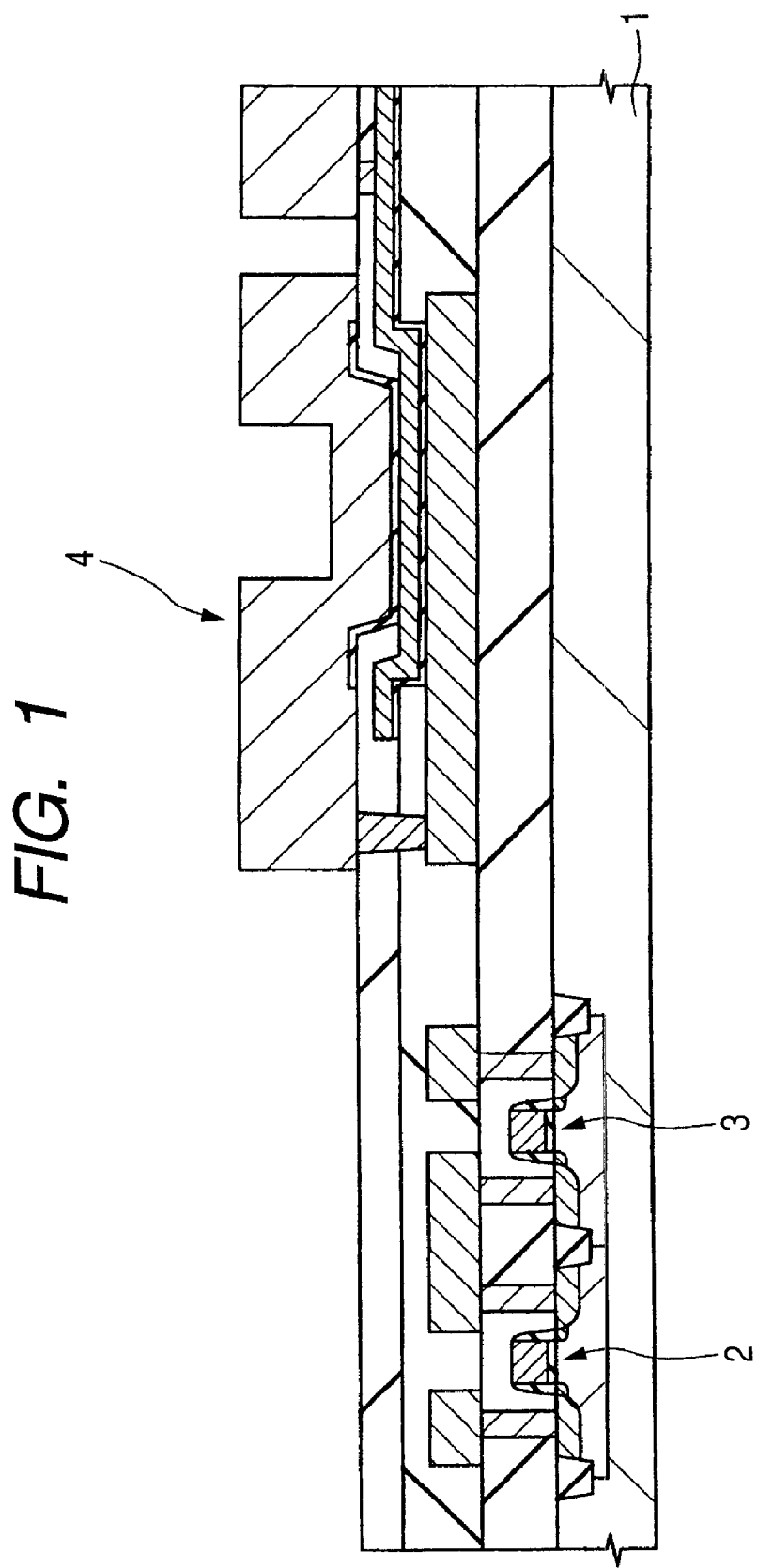
FIG. 1 is a cross-sectional view illustrating a portion of a semiconductor device according to Embodiment 1 of the present invention.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number of elements is not limited to a specific number but can be greater than or less than the specific number unless otherwise specifically indicated or in the case it is principally apparent that the number is limited to the specific number.

Moreover in the below-described embodiments, it is needless to say that the constituting elements (including element steps) are not always essential unless otherwise specifically indicated or in the case where it is principally apparent that they are essential.

Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range.

Embodiments of the present invention will hereinafter be described specifically based on accompanying drawings. In all the drawings for describing the below-described embodiments, elements having like function will be identified by like reference numerals and overlapping descriptions will be omitted.

Embodiment 1

FIG. 1 is a cross-sectional view illustrating a portion of a semiconductor device of Embodiment 1. As illustrated in FIG. 1, an n channel MISFET (Metal Insulator Semiconductor Field Effect Transistor) 2 and a p channel MISFET 3 are formed over a semiconductor substrate 1 made of silicon single crystal. In a region other than the formation regions of the n channel MISFET 2 and p channel MISFET 3, a capacitor 4 having an MIM structure is formed. In short, MISFETs and capacitor are formed over the semiconductor substrate 1. In the drawings after FIG. 1, MISFETs formed over the semiconductor substrate 1 are omitted and only a capacitor formed over an interlayer insulating film is illustrated.

Figure 2:
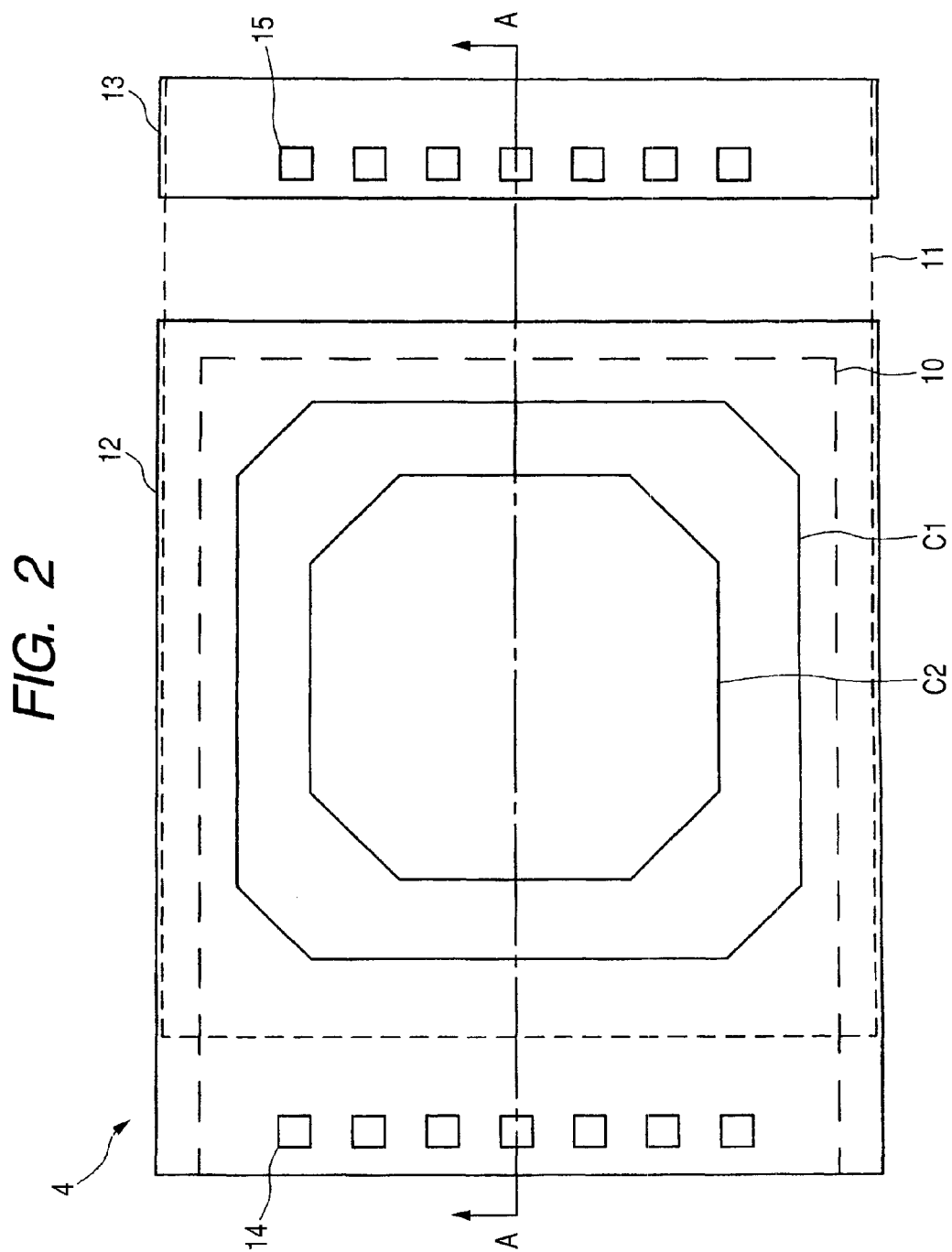
FIG. 2 is a plan view of the capacitor of Embodiment 1 viewed from above.

FIG. 2 is a plan view of the capacitor 4 viewed from above. In FIG. 2, a lower electrode (first electrode) 10 is formed in the capacitor 4 and it has an intermediate electrode (second electrode) 11 formed thereover via an insulating film (not illustrated). In a region where the lower electrode 10 overlaps with the intermediate electrode 11 on a plane, a capacitor (first capacitor) C1 is formed. Over the intermediate electrode 11, an upper electrode (third electrode) 12 and interconnect 13 are formed via an insulating film (illustrated), whereby in a region where the intermediate electrode 11 overlaps with the upper electrode 12 on a plane, a capacitor (second capacitor) C2 is formed. The lower electrode 10 and upper electrode 12 are electrically connected via a plug 14, while the intermediate 11 is connected to the interconnect 13 via a plug 15. The capacitor 4 has thus a structure obtained by stacking the capacitor C1 and capacitor C2 in a thickness direction of the substrate. In this Embodiment 1, the proportion of the area of the capacitors C1 and C2 in the semiconductor substrate can be made smaller than that of the capacitors arranged two-dimensionally without stacking them.

Figure 3:
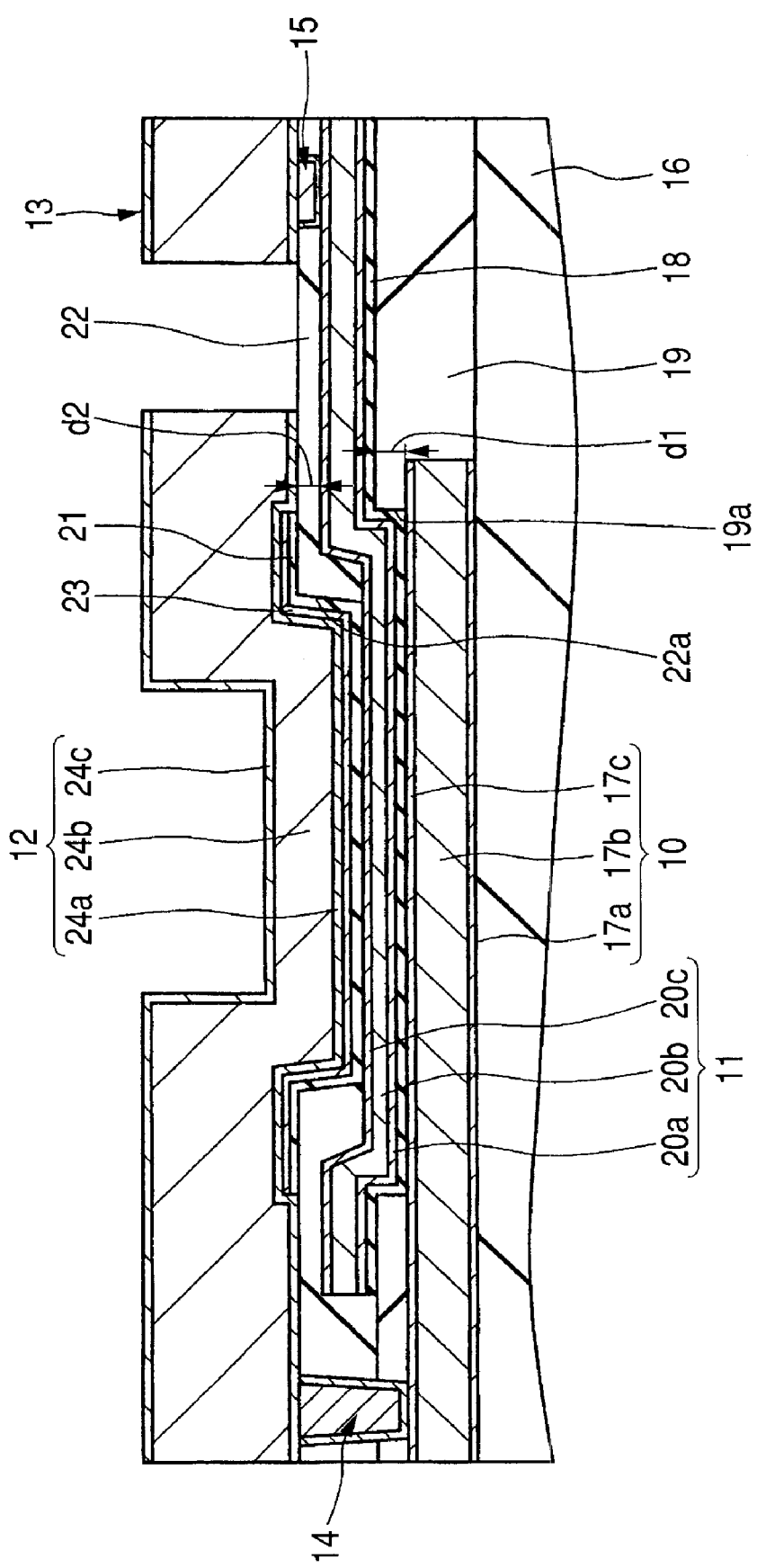
FIG. 3 is a cross-sectional view taken along a line A-A of FIG. 2.

FIG. 3 is a cross-sectional view taken along a line A-A of FIG. 2. As illustrated in FIG. 3, an insulating film 16 is formed as an interlayer insulating film over the semiconductor substrate and this insulating film 16 has the lower electrode 10 formed thereover. The lower electrode 10 is, for example, a film stack made of a titanium nitride film 17a, aluminum film 17b and titanium nitride film 17c. The lower electrode is not limited to the above-described one but may be made of a tungsten film or a film obtained by stacking a refractory metal such as titanium film or tungsten film on an aluminum film.

Over the insulating film 16 including the lower electrode 10, an insulating film (first insulating film) 19 is formed. This insulating film 19 has an opening portion (trench) 19a formed therein and the lower electrode 10 is exposed from the bottom of this opening portion 19a. Thus, the opening portion 19a is formed over one region of the lower electrode 10 and the insulating film 19 is formed over the other region. Accordingly, a step difference is formed over the lower electrode 10 by making the opening portion 19a over the lower electrode 10.

Over the insulating film 19 including the inside of the opening portion 19a, a capacitor insulating film (first capacitor insulating film) 18 is formed. This capacitor insulating film 18 is made of, for example, a silicon oxide film, silicon nitride film, aluminum oxide film or a film containing an oxide of tantalum, hafnium or the like. The capacitor insulating film 18 made of an aluminum oxide film or a film containing an oxide of tantalum, hafnium or the like is able to have a high dielectric constant, which enables improvement in a capacity density. The capacitor insulating film 18 made of a silicon oxide film or a silicon nitride film makes it possible to improve the breakdown voltage of the capacitor. In addition, when the capacitor insulating film 18 is made of a silicon oxide film or silicon nitride film, temperature dependence or frequency dependency of a dielectric constant can be reduced, in other words, the capacitor insulating film 18 have improved temperature characteristic and frequency characteristic.

The capacitor insulating film 18 is formed over the insulating film 19 including the inside of the opening portion 19a so that the capacitor insulating film 18 formed on the bottom of the opening portion 19a is in direct contact with the lower electrode 10. The capacitor insulating film 18 formed over the insulating film 19 other than the opening portion 19a, on the other hand, is not in direct contact with the lower electrode 10. In other words, the lower electrode 10 and the capacitor insulating film 18 have the insulating film 19 formed therebetween. Thus, a contact area and a non-contact area exist between the lower electrode 10 and the capacitor insulating film 18 and this is one of the characteristics of this Embodiment.

Over the capacitor insulating film 18, the intermediate electrode 11 is formed. The intermediate electrode 11 is made of, for example, a stack film of a titanium nitride 20a, aluminum film 20b and titanium nitride 20c, but it may be made of another material as in the case of the lower electrode 10. Since the intermediate electrode 11 is formed over the capacitor insulating film 18 including the inside of the opening portion 19a, it has a step difference. This intermediate electrode 11, capacitor insulating film 18 and lower electrode 10 constitute the capacitor C1 (refer to FIG. 2). At this time, the capacitor C1 is formed in the opening portion 19a. In other words, in the opening portion 19a, the capacitor insulating film 18 is formed directly on the lower electrode 10 and the intermediate electrode 11 is formed directly on the capacitor insulating film 18, making it possible to shorten the distance between the lower electrode 10 and intermediate electrode 11 and increase the capacitance. Accordingly, the capacitor C1 dominantly functions in the opening portion 19a having an increased capacitance. In a region other than the opening portion 19a, the insulating film 19 is formed between the lower electrode 10 and capacitor insulating film 18 so that the distance between the lower electrode 10 and the intermediate electrode 11 becomes greater than that in the opening portion 19a. The contribution to the capacitance is therefore smaller in the other region.

Conventionally, in a region of a lower electrode having an intermediate electrode thereover, the lower electrode was in direct contact with a capacitor insulating film. In this case, however, a distance between the lower electrode and the intermediate electrode in a region other than the formation region of a capacitor is small and almost equal to that in the formation region of the capacitor. This leads to the problem that when the intermediate electrode is used as electrodes other than the electrode of a capacitor, a parasitic capacitance becomes as large as that of the capacitor. In other words, as the parasitic capacitance of the intermediate electrode increases, the intermediate electrode becomes unsuited for use in as a general interconnect such as signal interconnect or power supply interconnect owing to an excessive increase in signal delay or power consumption.

In this Embodiment 1, a necessary capacitance is kept by decreasing the distance between the lower electrode 10 and intermediate electrode 11 in the capacitor formation region, while in a region other than the capacitor formation region, the distance between the lower electrode 10 and intermediate electrode 11 is made greater by disposing the insulating film 19 between the lower electrode 10 and intermediate electrode 11. Described specifically, in the capacitor formation region, the lower electrode 10 is brought into direct contact with the capacitance insulating film 18, but in the other region, the lower electrode is not brought into direct contact with the capacitor insulating film 18 by disposing the insulating film 19 therebetween. This increases the distance between the lower electrode 10 and intermediate electrode 11 in a region where the lower electrode 10 is not brought into direct contact with the capacitance insulating film 18 so that when the intermediate electrode 11 is used as a general interconnect, a parasitic capacitance occurring between it and the lower electrode 10 can be reduced. In other words, by a step difference formed over the lower electrode 10 by the opening portion 19a, the distance between the lower electrode 10 and intermediate electrode 11 in a region outside the opening portion 19a is made greater than that between the lower electrode 10 and intermediate electrode 11 in the opening portion 19a (capacitor formation region). An increase in signal delay or power consumption which will otherwise occur by using the intermediate electrode 11 as signal interconnect or power supply interconnect can therefore be prevented.

Over the intermediate electrode 11, an insulating film (second insulating film) 22 is formed and this insulating film 22 has an opening portion 22a formed therein. The intermediate electrode 11 is exposed from the bottom of this opening portion 22a. Over the insulating film 22 including the inside of the opening portion 22a, a capacitor insulating film (second capacitor insulating film) 21 is formed and this capacitor insulating film 21 has a titanium nitride film 23 formed thereover. Over the insulating film 22 including the upper surface of the titanium nitride film 23, the upper electrode 12 and interconnect 13 are formed.

The upper electrode 12 and interconnect 13 are each composed of a film stack of, for example, a titanium nitride film 24a, aluminum film 24b and titanium nitride film 24c. The upper electrode 12, capacitor insulating film 21 and intermediate electrode 11 constitute the capacitor C2 as illustrated in FIG. 2. In other words, in this Embodiment 1, the capacitors C1 and C2 are formed as a stacked structure. Since the capacitors C1 and C2 are stacked one after another, the space of the semiconductor substrate occupied by the capacitors can be reduced, whereby both size reduction of the semiconductor chip and cost reduction can be realized. In addition, owing to a reduction in the space occupied by the capacitors, elements having another function can be mounted on the semiconductor chip, whereby the semiconductor chip has heightened function and performance.

The upper electrode 12, capacitor insulating film 21 and intermediate electrode 11 constitute one capacitor C2 (refer to FIG. 2). In the opening portion 22a, the capacitor C2 is formed. In the opening portion 22a, the capacitor insulating film 21 is formed over the intermediate electrode 11 to be in direct contact therewith and the upper electrode 12 is formed directly on the capacitor insulating film 21 so that a distance between the intermediate electrode 11 and the upper electrode 12 decreases, which increases the capacitance. Accordingly, the capacitor C2 dominantly functions in the opening portion 22a having an increased capacitance. In a region other than the opening portion 22a (a region other than the formation region of the capacitor), the insulating film 22 is formed between the intermediate electrode 11 and capacitance insulating film 21 and the intermediate electrode 11 is not in direct contact with the capacitor insulating film 21. The distance between the intermediate electrode 11 and upper electrode 12 therefore becomes greater than that in the opening portion 22a and contribution to capacitance decreases. In short, the parasitic capacitance between the intermediate electrode 11 and upper electrode 12 can be reduced.

As illustrated in FIG. 3, the lower electrode 10 and upper electrode 12 are electrically connected via the plug 14. The intermediate electrode 11 is electrically connected with the interconnect 13 via the plug 15. Accordingly, the capacitor C1 having the lower electrode 10, capacitor insulating film 18 and intermediate electrode 11 is electrically connected in parallel with the capacitor C2 composed of the intermediate electrode 11, capacitor insulating film 21 and upper electrode 12. The total capacitance of the stacked capacitor C1 and capacitor C2 is the sum of the capacitance of the capacitor C1 and the capacitance of the capacitor C2. The total capacitance can be kept even if the space occupied by the capacitors is reduced by stacking.

According to Embodiment 1, even if the space of capacitors is reduced by stacking them, the total capacitance can be kept by connecting the stacked capacitors in parallel. In a region other than the formation region of the capacitors, the distance between electrodes can be made greater than that in the formation region of the capacitors so that a parasitic capacitance can be reduced. This contributes to the realization of a reduction in signal delay or power consumption, making it possible to use the electrode of the capacitors as a signal interconnect or power supply interconnect. In addition, since the electrode can be used as a general interconnect, the wiring length on the semiconductor chip can be shortened, whereby the parasitic capacitance and interconnect resistance of the interconnect can be reduced. Moreover, the electrode can be commonly used as a general interconnect, the number of interconnects can be reduced, making it possible to promote the size reduction of semiconductor chips. In addition, the electrode can be used as a general interconnect so that design freedom such as design of interconnects can be enhanced.

According to Embodiment 1, the capacitor C1 is formed in the opening portion 19a and in the opening portion 22a smaller than the opening portion 19a, the capacitor C2 is formed. The contact area of the capacitor insulating film 18 with the lower electrode 10 becomes greater than that of the capacitor insulating film 21 with the intermediate electrode 11.

Results of comparison in the capacitance (interlayer capacitance) when the intermediate electrode is used as a general interconnect between a capacitor having a structure investigated by the present inventors and a capacitor having the structure of Embodiment 1 will next be shown.

As illustrated in FIG. 3, d1 represents the distance between the lower electrode 10 and intermediate electrode 11 and d2 represents the distance between the intermediate electrode 11 and upper electrode 12, each in a region other than the formation region of the capacitors. This means that the distance between two electrodes in a region other than the formation region of the capacitors is greater than that in the formation region of the capacitors (the region within the opening portions 19a and 22a).

Figure 4:
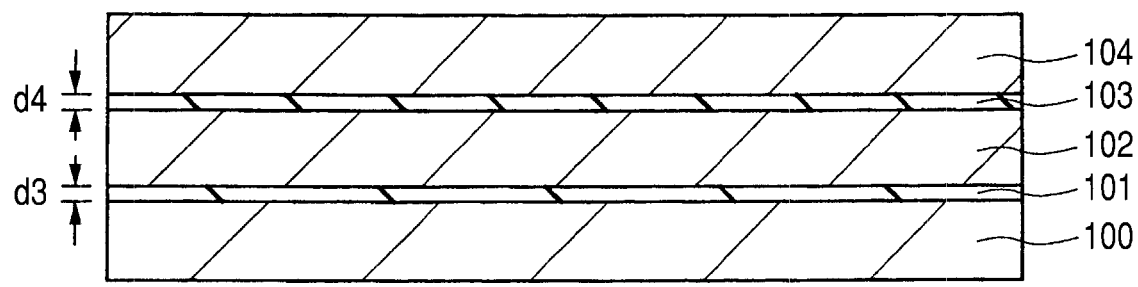
FIG. 4 is a cross-sectional view illustrating a capacitor investigated by the present inventors.

The structure investigated by the present inventors is shown in FIG. 4. As illustrated in FIG. 4, a lower electrode 100, a capacitor insulating film 101, an intermediate electrode 102, a capacitor insulating film 103 and an upper electrode 104 are stacked one after another in the structure investigated by the present inventors. Either in the formation region of capacitors or in a region other than the formation region of the capacitors, the distance between the lower electrode 100 and intermediate electrode 102 is represented by d3. Similarly, the distance between the intermediate electrode 102 and upper electrode 104 is represented by d4 either in the formation region of capacitors or in a region other than the formation regions of capacitors.

A ratio of the parasitic capacitance (parasitic capacitance of Embodiment 1/parasitic capacitance of the structure investigated by the present inventors) occurring between the intermediate electrode and lower electrode can be expressed as $(e1/d1)/(e2/d3)=(e1 \cdot d3)/(e2 \cdot d1)$. Similarly, a ratio of the parasitic capacitance occurring between the intermediate electrode and upper electrode can be expressed as $(e1/d2)/(e2/d4)=(e1 \cdot d4)/(e2 \cdot d2)$.

In the structure according to Embodiment 1, supposing that the capacitor insulating film 18 and capacitance insulating film 21 are each made of a silicon oxide film, e1 is 4.2. Each of d1 and d2 is set at 500 nm. Supposing that the capacitor insulating film 101 and capacitor insulating film 103 are each made of a silicon nitride film, e2 is 7. Each of d3 and d4 is set at 50 nm.

Following calculation results can be obtained when a reduction in the parasitic capacitance in Embodiment 1 is calculated under the above-described conditions. Supposing that the parasitic capacitance of the structure investigated by the present inventors is 100, the parasitic capacitance of the structure of Embodiment 1 is 6, suggesting one-tenth or more reduction in parasitic capacitance.

When the intermediate electrode is used as general interconnects such as signal interconnects or power supply interconnects, the signal delay caused by them is proportional to interconnect resistance×parasitic capacitance and the power consumption is also proportional to the parasitic capacitance. The parasitic capacitance is usually the sum of the parasitic capacitance between two adjacent interconnects in the same layer and the parasitic capacitance between the interconnects of the upper layer and lower layer. When the distance between two adjacent interconnects in the same layer is large and the parasitic resistance between them can be neglected, the parasitic capacitance corresponds to that between the interconnects of the upper layer and lower layer. Under such conditions, the parasitic capacitance can be reduced to one-tenth or more so that signal delay and power consumption when the intermediate electrode is used as the interconnect can be reduced to one-tenth at maximum. In other words, compared with the use of the intermediate electrode having the structure investigated by the present inventors, it is possible to reduce the parasitic resistance drastically in Embodiment 1 so that a reduction in the signal delay and power consumption due to interconnects can be realized.

The manufacturing method of the capacitor according to Embodiment 1 will next be described referring to accompanying drawings.

Figure 5:
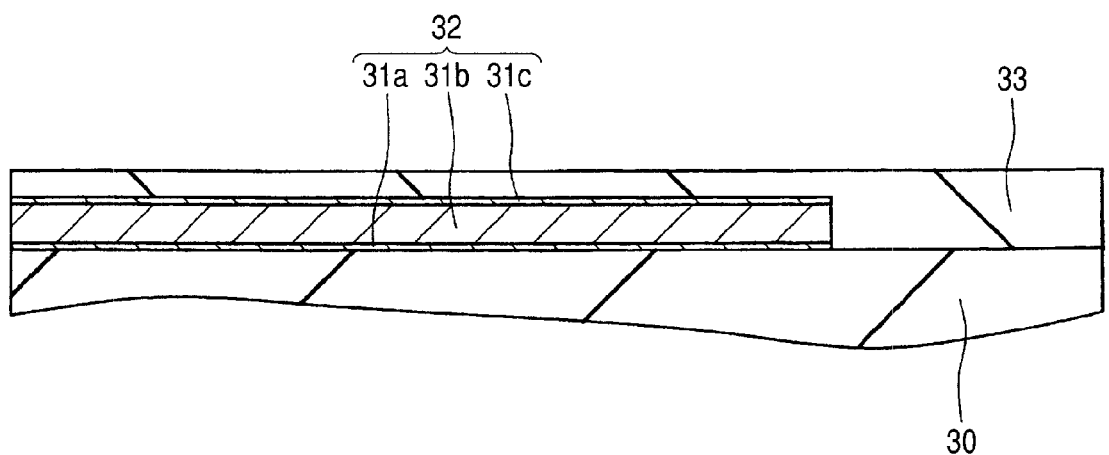
FIG. 5 is a cross-sectional view illustrating a manufacturing step of the capacitor of Embodiment 1.

First, an MISFET is formed over a semiconductor substrate which is not illustrated and an interconnect to be connected to this MISFET is then formed. An insulating film 30 which will be an interlayer insulating film is then formed over the interconnect. FIG. 5 illustrates a step after formation of the insulating film 30. The insulating film 30 is made of, for example, a silicon oxide film and can be formed, for example, by CVD (Chemical Vapor Deposition).

A titanium nitride film 31a, aluminum film 31b and titanium nitride film 31c are successively stacked over the insulating film 30. The titanium nitride film 31a, aluminum film 31b and titanium nitride film 31c can be formed, for example, by sputtering. Then, by photolithography and etching, the titanium nitride film 31a, aluminum film 31b and titanium nitride film 31c are patterned, whereby a lower electrode (first electrode) 32 made of the titanium nitride film 31a, aluminum film 31b and titanium nitride film 31c is formed. An insulating film (first insulating film) 33 is then formed over the insulating film 30 including the lower electrode 32. This insulating film 33 can also be made of a silicon oxide film by using, for example, CVD.

Figure 6:
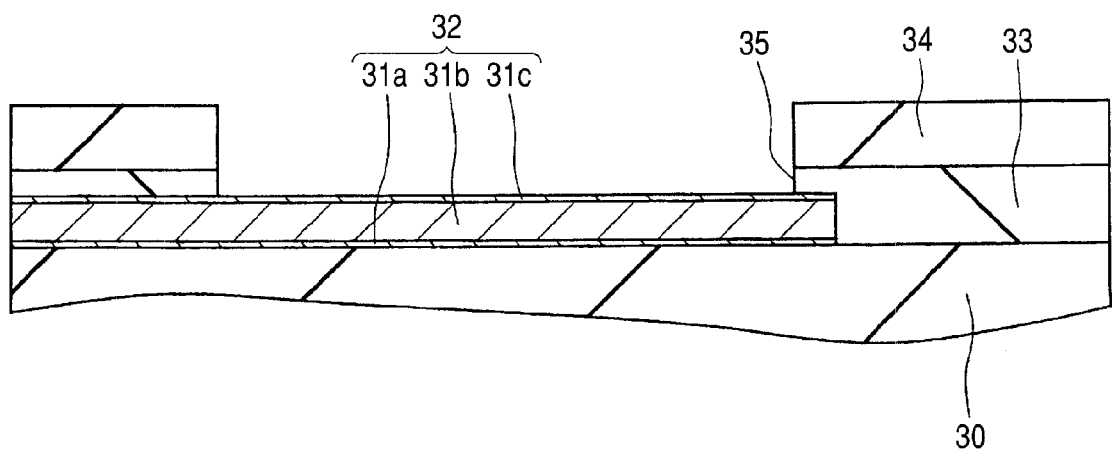
FIG. 6 is a cross-sectional view illustrating a manufacturing step of the capacitor following that of FIG. 5.

As illustrated in FIG. 6, after application of a resist film 34 over the insulating film 33, the resist film 24 is subjected to exposure and development to pattern the resist film 34. This patterning is conducted so as to avoid remaining of the resist film 34 in a region in which an opening portion 35 is to be formed. With the patterned resist film 34 as a mask, the insulating film 33 is etched, whereby the opening portion (first opening portion) 35 is formed in the insulating film 33. From the bottom of this opening portion 35, the lower electrode 32 is exposed.

Figure 7:
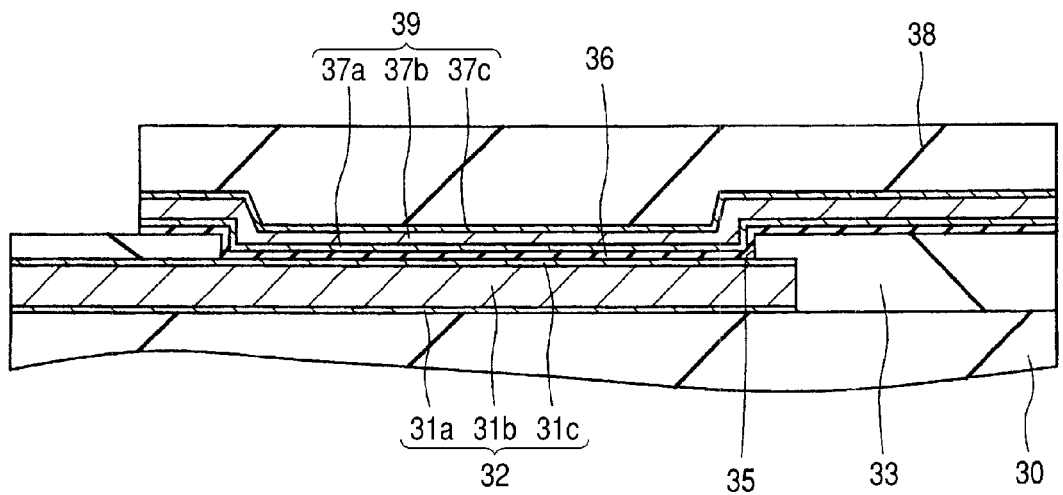
FIG. 7 is a cross-sectional view illustrating a manufacturing step of the capacitor following that of FIG. 6.

After removal of the resist film 34, a capacitor insulating film (first capacitor insulating film) 36 is formed over the insulating film 33 including the inside of the opening portion 35 as illustrated in FIG. 7. The capacitor insulating film 36 can be formed, for example, by CVD and it is made of, for example, a silicon oxide film, silicon nitride film, aluminum oxide film or film containing an oxide of tantalum, hafnium or the like.

Over the capacitor insulating film 36, a titanium nitride film 37a, aluminum film 37b and titanium nitride film 37c are formed successively by sputtering (first conductor film). After application of a resist film 38 onto the titanium nitride film 37c, the resist film 28 is subjected to exposure and development to pattern the resist film 38. This patterning is conducted so as to leave the resist film 38 in the formation region of an intermediate electrode. By etching with the thus-patterned resist film 38 as a mask, the intermediate electrode (second electrode) 39 is formed. At this time, a first capacitor is formed of the lower electrode 32, capacitor insulating film 36 and intermediate electrode 39 in the opening portion 35. In a region outside the opening portion 35, on the other hand, the lower electrode 32 is not in direct contact with the capacitor insulating film 36 and the insulating film 33 is formed between the lower electrode 32 and intermediate electrode 39. This region is not the formation region of the capacitor so that a distance between the lower electrode 32 and the intermediate electrode 39 is greater than that in the formation region of the capacitor to reduce the parasitic capacitance.

Figure 8:
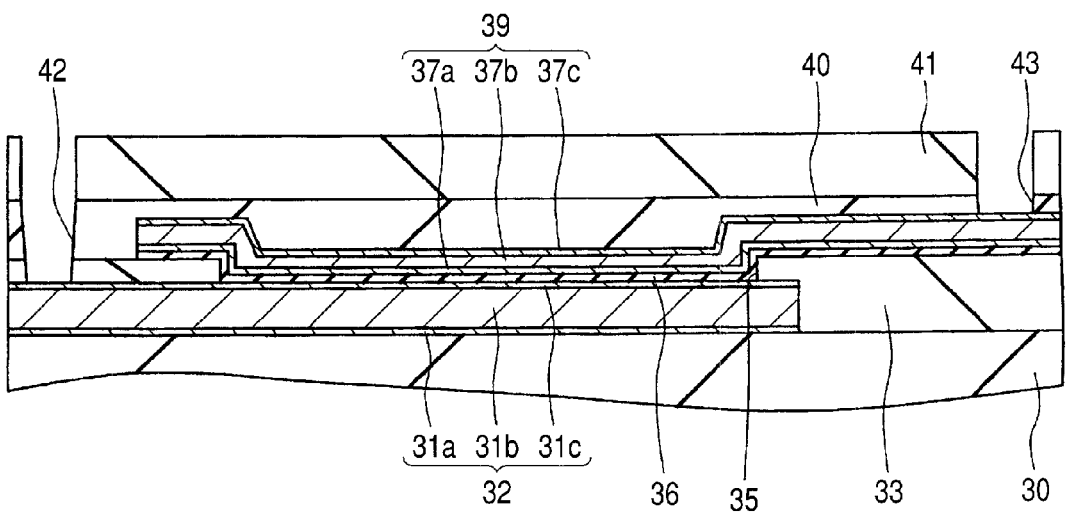
FIG. 8 is a cross-sectional view illustrating a manufacturing step of the capacitor following that of FIG. 7.

As illustrated in FIG. 8, after removal of the resist film 38, an insulating film (second insulating film) 40 is formed over the insulating film 33 including the upper surface of the intermediate electrode 39. After application of a resist film 41 onto the insulating film 40, exposure and development are carried out to pattern the resist film 41. This patterning is conducted so as to avoid remaining of the resist film 41 in the formation region of a connecting hole. By etching with the thus-patterned resist film 41 as a mask, a connecting hole 42 and a connecting hole 43 are formed. The connecting hole 42 reaches the lower electrode 32, while the connecting hole 43 reaches the intermediate electrode 39.

Figure 9:
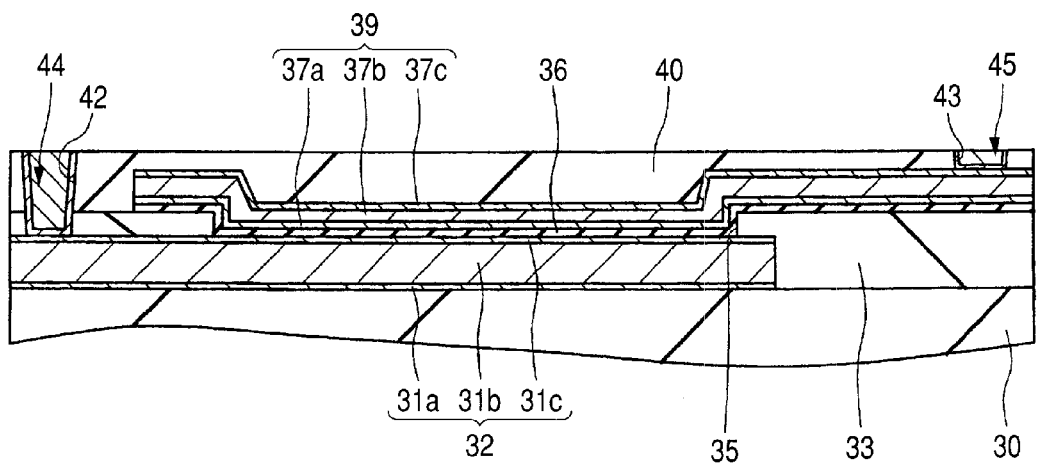
FIG. 9 is a cross-sectional view illustrating a manufacturing step of the capacitor following that of FIG. 8.

After removal of the resist film 41, a conductive material is filled in the connecting hole 42 and connecting hole 43 to form a plug 44 and plug 45 as illustrated in FIG. 9. The plug 44 and plug 45 are formed by forming, for example, a film stack of a titanium nitride film and a tungsten film over the insulating film 40 including the inside of the connecting holes 42 and 43 and then polishing the film stack formed over the insulating film 40 by CMP (Chemical Mechanical Polishing).

Figure 10:
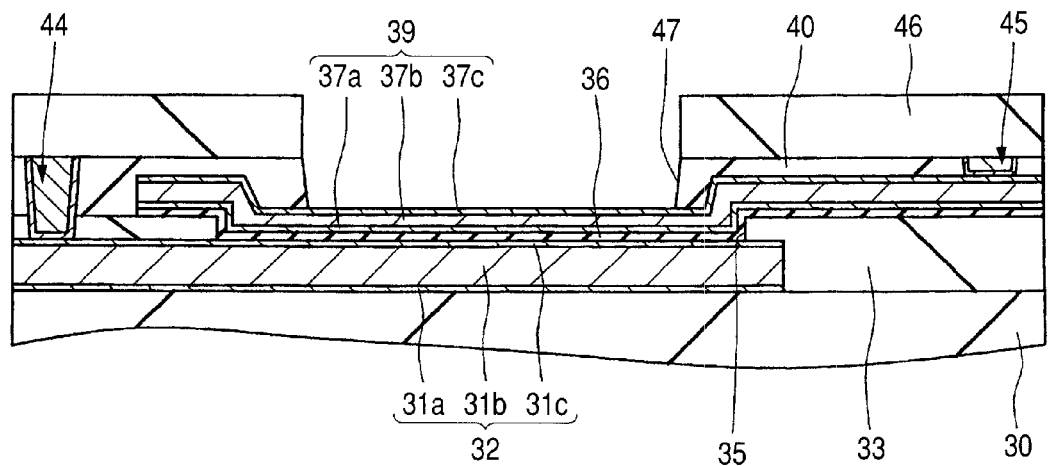
FIG. 10 is a cross-sectional view illustrating a manufacturing step of the capacitor following that of FIG. 9.

As illustrated in FIG. 10, after application of a resist film 46 onto the insulating film 40, exposure and development are carried out to pattern the resist film 46. This patterning is carried out so as to avoid remaining of the resist film 46 in the formation region of an opening portion. By etching with the thus-patterned resist film 46 as a mask, the opening portion (second opening portion) 47 is formed.

Figure 11:
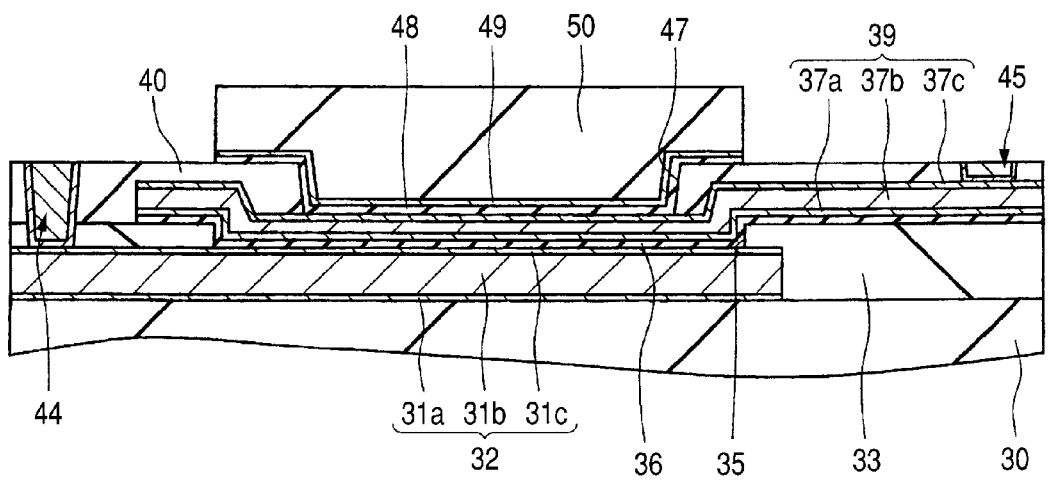
FIG. 11 is a cross-sectional view illustrating a manufacturing step of the capacitor following that of FIG. 10.

As illustrated in FIG. 11, a capacitor insulating film (second capacitor insulating film) 48 and titanium nitride film 49 are stacked over the insulating film 40 including the inside of the opening portion 47. After application of a resist film 50 over the titanium nitride film 49, exposure and development are carried out to pattern the resist film 50. With the resist film 50 thus patterned as a mask, the capacitor insulating film 48 and titanium nitride film 49 are etched.

Figure 12:
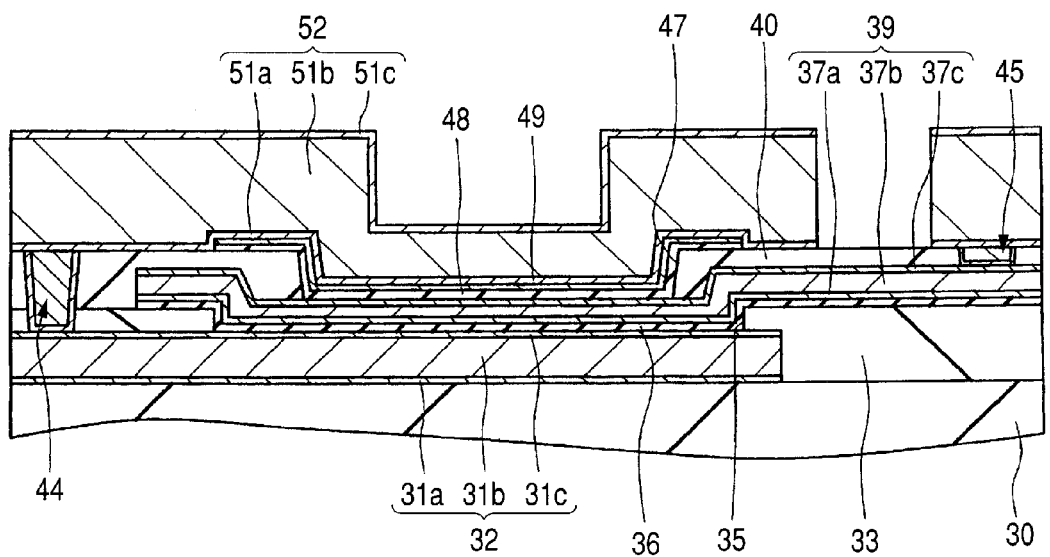
FIG. 12 is a cross-sectional view illustrating a manufacturing step of the capacitor following that of FIG. 11.

As illustrated in FIG. 12, a titanium nitride film 51a, aluminum film 51b and titanium nitride film 51c are formed successively over the insulating film 40 including the patterned titanium nitride film 49 by sputtering (second conductor film). By photolithography and etching, these films are patterned to form an upper electrode (third electrode) 52 composed of the titanium nitride film 51a, aluminum film 51b and titanium nitride film 51c. A second capacitor composed of the intermediate electrode 39, capacitor insulating film 48 and upper electrode 52 is thus formed in the opening portion 47. In a region outside the opening portion 47, the insulating film 40 has been formed between the intermediate electrode 39 and upper electrode 52. Since the distance between the intermediate electrode 39 and upper electrode 52 becomes greater than that in the capacitor formation region, a parasitic capacitance of the intermediate electrode 39 can be reduced. The intermediate electrode 39 is connected to, for example, a general interconnect formed in the same layer in which the upper electrode 52 exists. In such a manner, the capacitor in Embodiment 1 can be formed.

Embodiment 2

In Embodiment 1, the intermediate interconnect 39 connected to an upper-level interconnect was described. In Embodiment 2, on the other hand, a manufacturing method of an interconnect 39 connected not only to an upper-level interconnect but also to a lower-level interconnect will be described referring to accompanying drawings.

Figure 13:
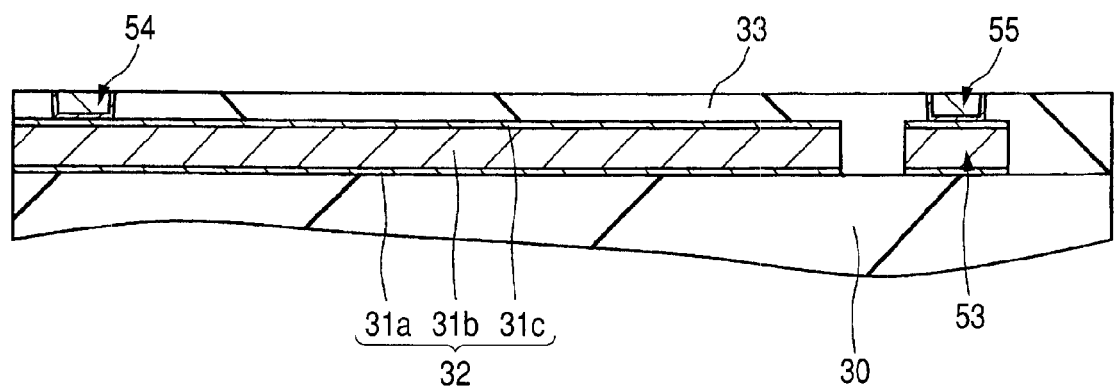
FIG. 13 is a cross-sectional view illustrating a manufacturing step of a capacitor of Embodiment 2.

As illustrated in FIG. 13, a titanium nitride film 31a, aluminum film 31b and titanium nitride film 31c are successively stacked over an insulating film 30. The titanium nitride film 31a, aluminum film 31b and titanium nitride film 31c can be formed using, for example, sputtering. By photolithography and etching, the titanium nitride film 31a, aluminum film 31b and titanium nitride film 31c are patterned to form a lower electrode (first electrode) 32 and a lower-level interconnect 53 each composed of the titanium nitride film 31a, aluminum film 31b and titanium nitride film 31c. An insulating film (first insulating film) 33 is then formed over the insulating film 30 including the lower electrode 32 and lower-level interconnect 53. This insulating film 33 can be made of a silicon oxide film by using, for example, CVD.

By photolithography and etching, connecting holes are formed in the insulating film 33. One of the connecting holes reaches the lower electrode 32 and one of the other connecting holes reaches the lower-level interconnect 53. After formation of a film stack composed of a titanium nitride film and tungsten film over the insulating film 33 including the inside of the connecting holes, the film stack is left only within the connecting holes by using CMP, whereby a plug 54 and plug 55 are formed.

Figure 14:
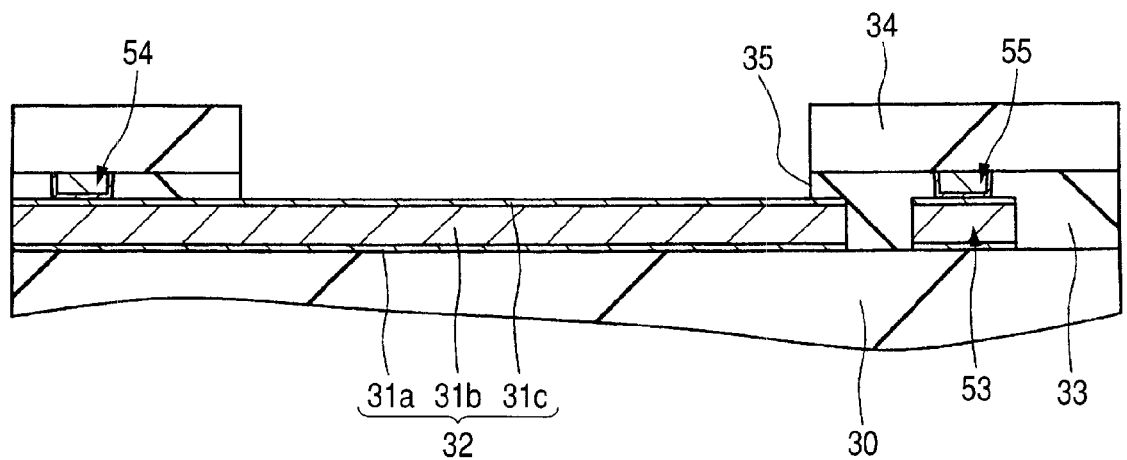
FIG. 14 is a cross-sectional view illustrating a manufacturing step of the capacitor following that of FIG. 13.

As illustrated in FIG. 14, after application of a resist film 34 onto the insulating film 33, the resist film 34 is subjected to exposure and development to pattern the resist film 34. This patterning is conducted so as to avoid remaining of the resist film 34 in the formation region of an opening portion 35. With the patterned resist film 34 as a mask, the insulating film 33 is etched, whereby the opening portion (first opening portion) 35 is formed in the insulating film 33. The lower electrode 32 is exposed from the bottom of the opening portion 35.

Figure 15:
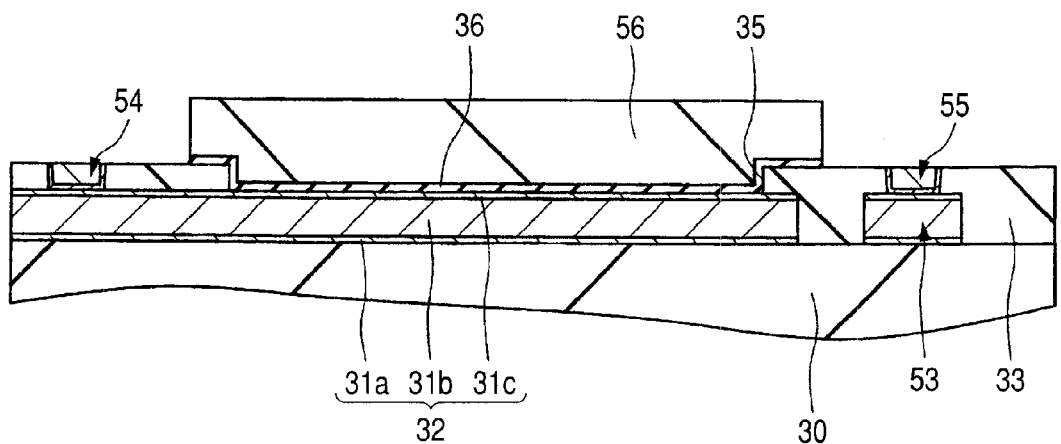
FIG. 15 is a cross-sectional view illustrating a manufacturing step of the capacitor following that of FIG. 14.

As illustrated in FIG. 15, after removal of the resist film 34, a capacitor insulating film (first capacitor insulating film) 36 is formed over the insulating film 33 including the inside of the opening portion 35. After application of a resist film 56 onto the capacitor insulating film 36, exposure and development are carried out to pattern the film. This patterning is conducted so as to leave the resist film 56 in a region in which the capacitor insulating film 36 is left.

Figure 16:
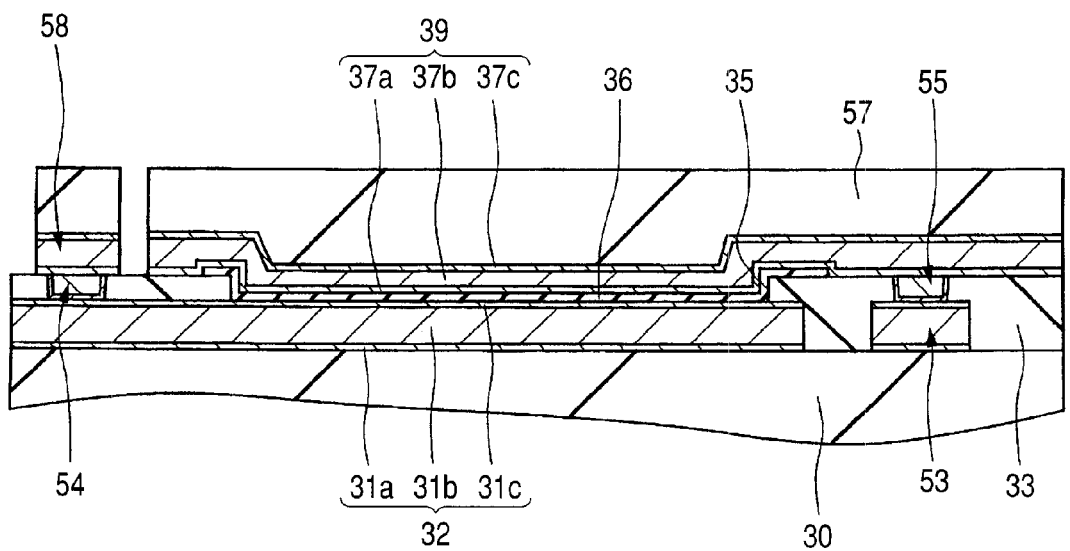
FIG. 16 is a cross-sectional view illustrating a manufacturing step of the capacitor following that of FIG. 15.

As illustrated in FIG. 16, after removal of the resist film 56, a titanium nitride film 37a, aluminum film 37b and titanium nitride film 37c are formed successively over the insulating film 33 including the capacitor insulating film 36 by sputtering (first conductor film). A resist film 57 is then applied to the titanium nitride film 37c and the resulting resist film 57 is subjected to exposure and development to pattern the resist film 57. This patterning is conducted so as to leave the resist film 57 in the formation region of the intermediate electrode and the formation region of the interconnect. By etching with the patterned resist film 57 as a mask, the intermediate electrode (second electrode) 39 and interconnect 58 are formed.

In Embodiment 1, the intermediate electrode 39 was formed by stacking the capacitor insulating film 36, titanium nitride film 37a, aluminum film 37b and titanium nitride film 37c successively and then patterning these films. In this method, however, the capacitor insulating film 36 formed between the intermediate electrode 39 and plug 55 prevents electrical conduction between the intermediate electrode 39 and lower-level interconnect 53. In this Embodiment 2, on the other hand, after formation of the capacitor insulating film 36, it is patterned so as not to leave it on the plug 55. The intermediate electrode 39 is thereafter formed in order to provide electrical connection between the intermediate electrode and the lower-level interconnect via the plug 55. The intermediate electrode 39 can therefore be electrically connected to the lower-level interconnect 53.

Figure 17:
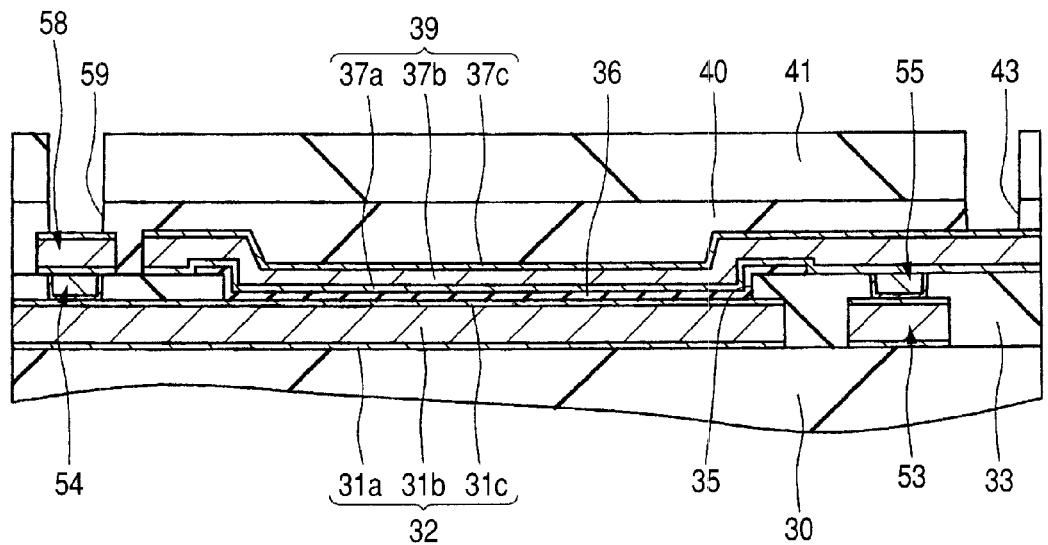
FIG. 17 is a cross-sectional view illustrating a manufacturing step of the capacitor following that of FIG. 16.

As illustrated in FIG. 17, after removal of the resist film 57, an insulating film (second insulating film) 40 is formed over the insulating film 33 including the upper surface of the intermediate electrode 39. This insulating film 40 can be made of a silicon oxide film by using, for example, CVD. After application of a resist film 41 onto the insulating film 40, exposure and development are carried out to pattern the resist film 41. This patterning is conducted so as not to leave the resist film 41 in the formation region of connecting holes. By etching with the patterned resist film 41 as a mask, connecting hole 43 and connecting hole 59 are formed. The connecting hole 43 reaches the intermediate electrode 39, while the connecting hole 59 reaches the interconnect 58.

Figure 18:
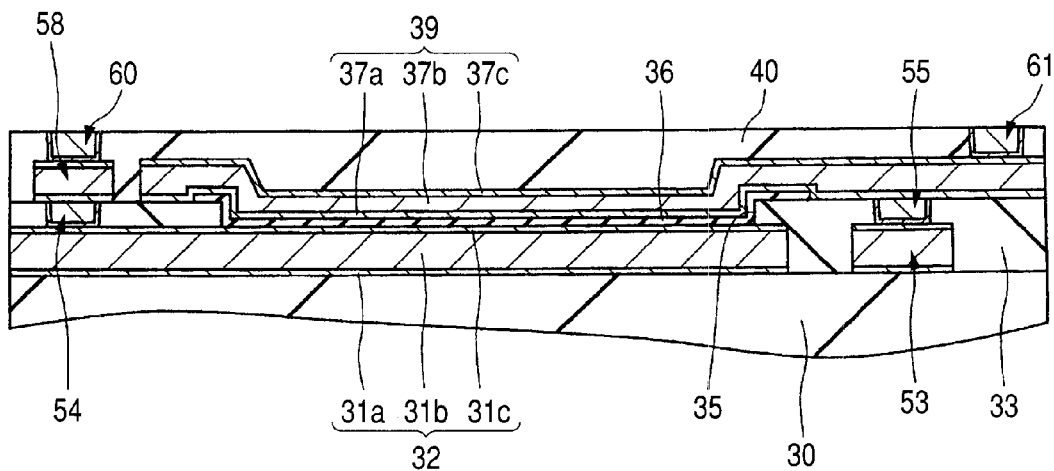
FIG. 18 is a cross-sectional view illustrating a manufacturing step of the capacitor following that of FIG. 17.

As illustrated in FIG. 18, after removal of the resist film 41, a conductive material is filled in the connecting hole 43 and connecting hole 59 to form a plug 60 and plug 61. The plug 60 and plug 61 are formed, for example, by forming a film stack of a titanium nitride film and tungsten film over the insulating film 40 including the inside of the connecting holes 43 and 59 and then polishing the film stack formed over the insulating film 40 by CMP.

Figure 19:
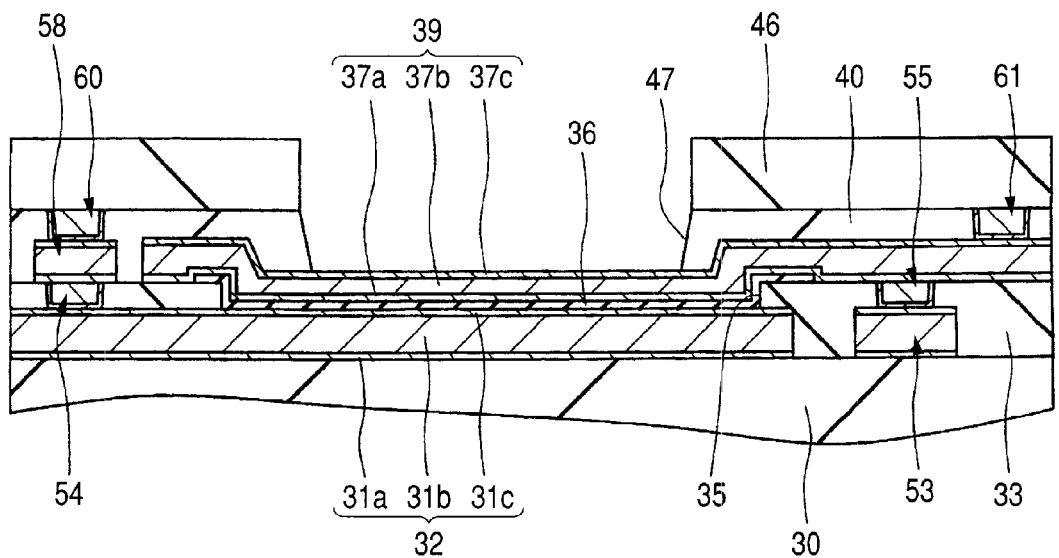
FIG. 19 is a cross-sectional view illustrating a manufacturing step of the capacitor following that of FIG. 18.

As illustrated in FIG. 19, after application of a resist film 46 onto an insulating film 40, exposure and development are carried out to pattern the resist film 46. This patterning is conducted so as not to leave the resist film 46 in the formation region of an opening portion. By etching with the patterned resist film 46 as a mask, an opening portion (second opening portion) 47 is formed.

Figure 20:
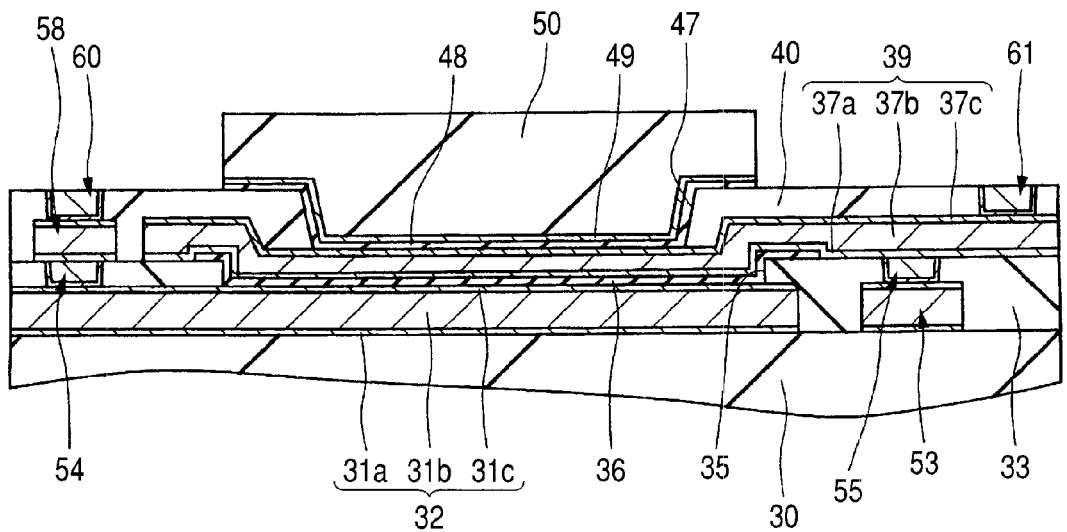
FIG. 20 is a cross-sectional view illustrating a manufacturing step of the capacitor following that of FIG. 19.

As illustrated in FIG. 20, a capacitor insulating film (second capacitor insulating film) 48 and a titanium nitride film 49 are stacked over the insulating film 40 including the inside of the opening portion 47. After application of a resist film 40 onto the titanium nitride film 49, exposure and development are carried out to pattern the resist film 50. With the patterned resist film 50 as a mask, the capacitor insulating film 48 and titanium nitride film 49 are etched.

Figure 21:
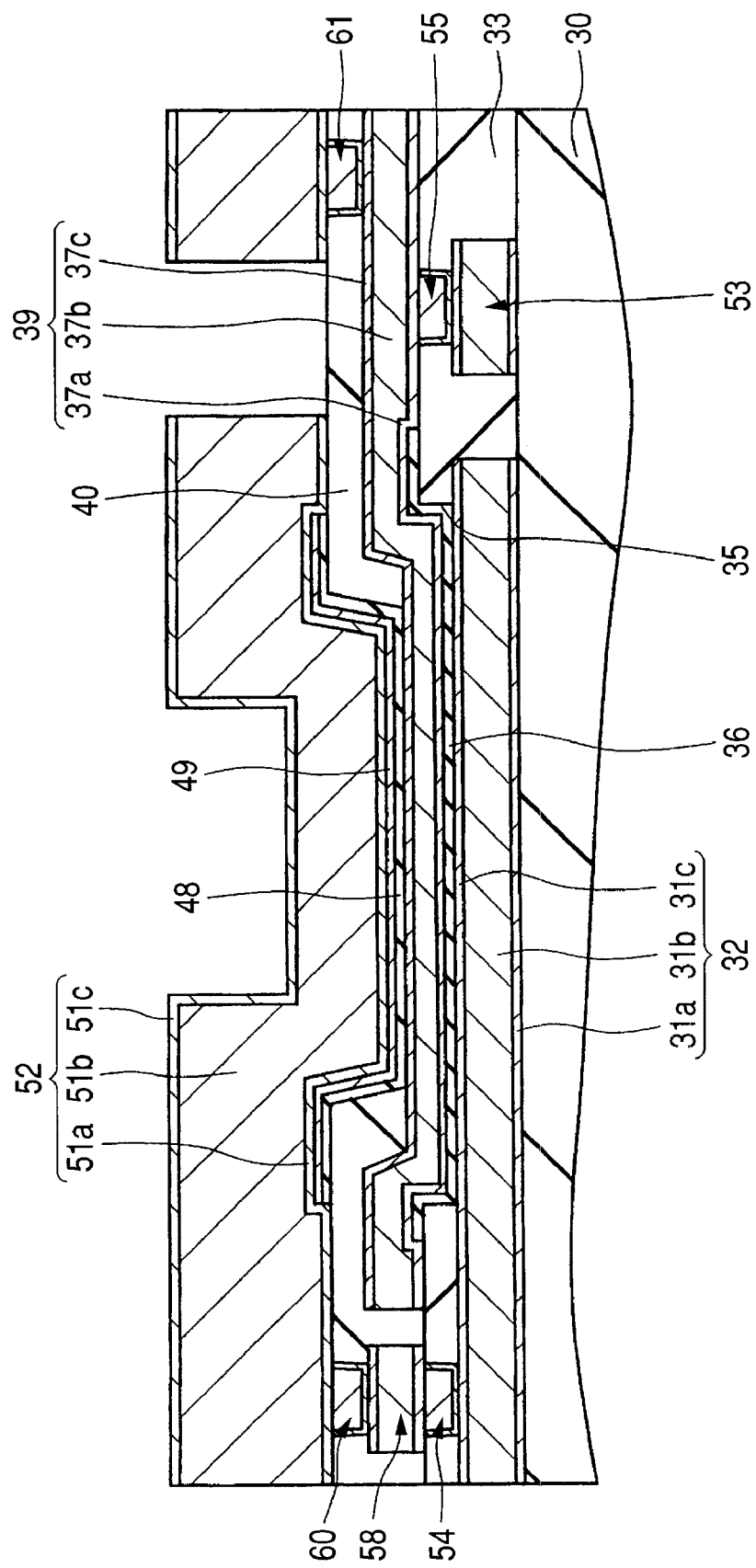
FIG. 21 is a cross-sectional view illustrating a manufacturing step of the capacitor following that of FIG. 20.

As illustrated in FIG. 21, a titanium nitride film 51a, aluminum film 51b and titanium nitride film 51c are formed successively over the insulating film 40 including the patterned titanium nitride film 49 (second conductor film). By photolithography and etching, these films are patterned to form an upper electrode (third electrode) 52 composed of the titanium nitride film 51a, aluminum film 51b and titanium nitride film 51c. In such a manner, the intermediate electrode 39 can be connected to the upper-level and lower-level interconnects. According to this Embodiment 2, the intermediate electrode 39 to be connected to a general interconnect can be connected to not only an upper-level interconnect but also a lower-level interconnect so that freedom of the interconnect formation can be enhanced. By this Embodiment 2, similar effects to those available by Embodiment 1 can be obtained.

Embodiment 3

Figure 22:
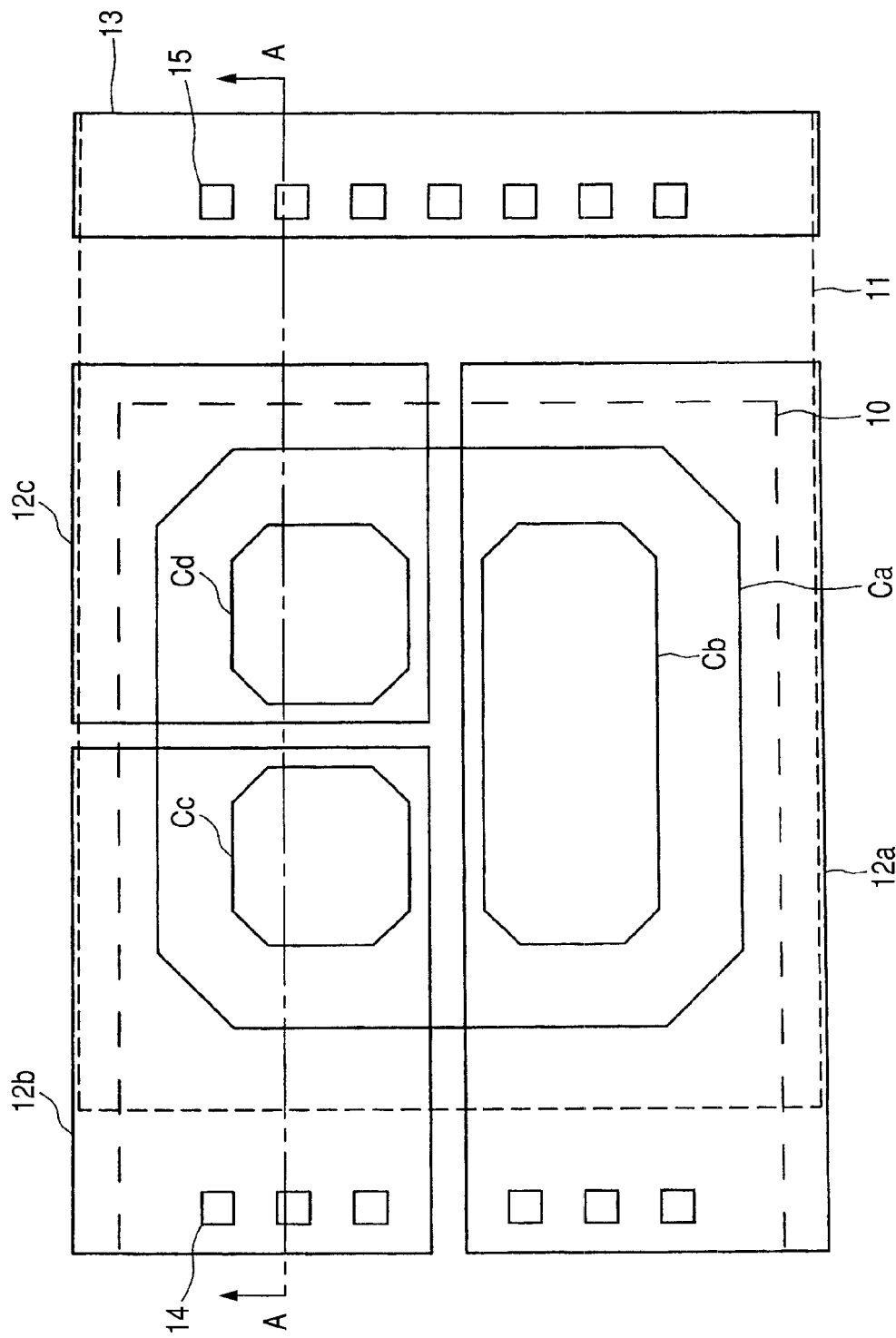
FIG. 22 is a plan view illustrating a capacitor of Embodiment 3 viewed from above.
Figure 24:
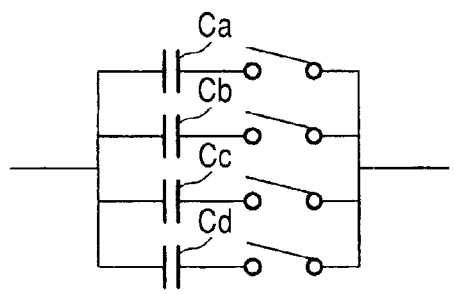
FIG. 24 is a circuit diagram of capacitors connected in parallel.

In this Embodiment 3, an example of forming a variable capacitor having a stacked structure will be explained. FIG. 22 is a plain view illustrating the capacitor of Embodiment 3. In FIG. 22, a lower electrode 10 is formed and this lower electrode 10 has an intermediate electrode 11 formed thereover via an insulating film (not illustrated). In a region where the lower electrode 10 and intermediate electrode 11 two-dimensionally overlap each other, a capacitor Ca is formed. Over the intermediate electrode 11, upper electrodes 12a to 12c and an interconnect 13 are formed via an insulating film (not illustrated). In a region where the intermediate 11 and upper electrode 12a two-dimensionally overlap each other, a capacitor Cb is formed, while in a region where the intermediate 11 and upper electrode 12b two-dimensionally overlap each other, a capacitor Cc is formed. In a region where the intermediate 11 and upper electrode 12c two-dimensionally overlap each other, a capacitor Cd is formed. In this Embodiment 3, capacitors Cb, Cc and Cd are formed over the capacitor Ca. The upper electrodes 12a to 12c are connected to the lower electrode 10, for example, via a plug 14. The intermediate electrode 11 is connected to the interconnect 13, for example, via a plug 15. This means that the capacitors Ca, Cb, Cc, and Cd are connected in parallel to each other. The circuit diagram of them is shown in FIG. 24. As illustrated in FIG. 24, the capacitors Ca, Cb, Cc and Cd are connected in parallel and each capacitor has its own switch. A variable capacitor can be formed by them. For example, when a switch connected to the capacitor Ca is turned on, the capacitance of the variable capacitor becomes that of the capacitor Ca. When the switch of the capacitor Ca and that of the capacitor Cb are turned on, the capacitance of the variable capacitor becomes the sum of the capacitance of the capacitor Ca and that of the capacitor Cb. By selecting the switch as needed, a desired capacitance can be obtained. According to Embodiment 3, by stacking a plurality of capacitors and using them in combination with respective switches, a variable capacitor having high flexibility can be formed while reducing the space occupied by the capacitor.

Figure 23:
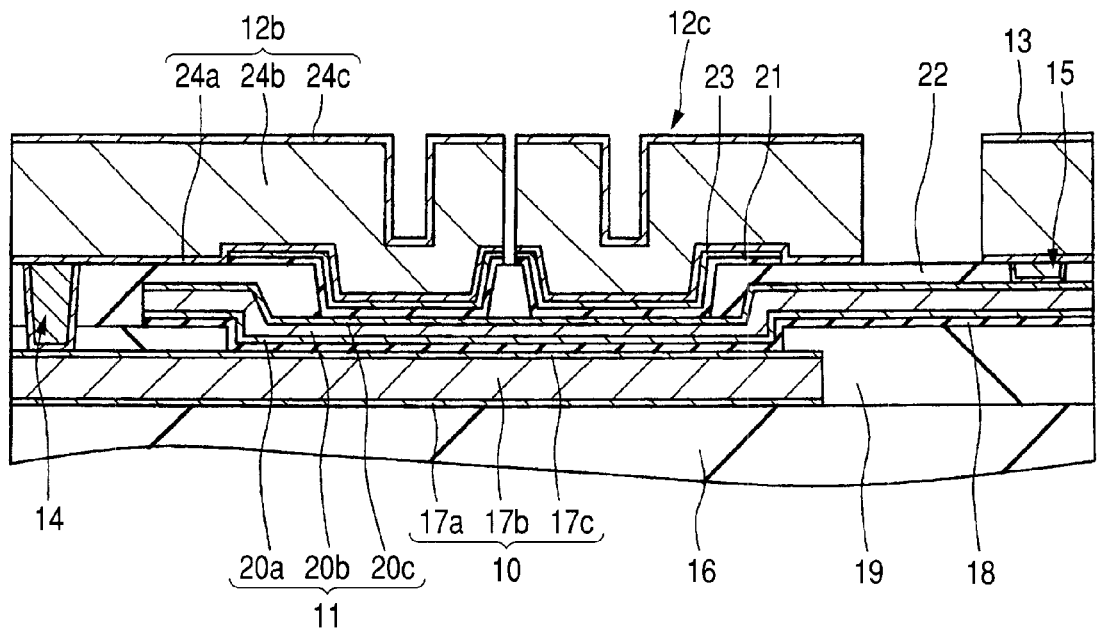
FIG. 23 is a cross-sectional view taken along a line A-A of FIG. 22.

FIG. 23 is a cross-sectional view taken along a line A-A of FIG. 22. The constitution of FIG. 23 is almost similar to that of Embodiment 1 except that it has an upper electrode 12b and upper electrode 12c. In Embodiment 3, the intermediate electrode 11 and upper electrode 12b constitute the capacitor Cc and the intermediate 11 and upper electrode 12c constitute the capacitor Cd. Similar to Embodiment 1, the intermediate electrode 11 has a step difference. This means that the distance between the intermediate electrode 11 and lower electrode 10 becomes smaller in the capacitor formation region (in the opening portion), while the distance between the intermediate electrode 11 and lower electrode 10 becomes greater in a region other than the capacitor formation region (outside the opening portion). Such a structure is considered with a view to reducing the parasitic capacitance between the intermediate electrode 11 and each of the upper electrodes 12b and 12c. This enables a reduction of the parasitic capacitance between the intermediate electrode 11 and lower electrode 10 so that increases in signal delay and power consumption which will otherwise occur by using the intermediate electrode 11 as a general interconnect can be prevented.

A manufacturing method of the variable capacitor in this Embodiment 3 is fundamentally similar to that of Embodiment 1. What is characteristic in this embodiment is that as illustrated in FIG. 23, in one of two opening portions made in the insulating film 22 formed over the intermediate electrode 11, the capacitor insulating film 21 and upper electrode 12b are formed to constitute the capacitor Cc while in the other opening portion, the capacitor insulating film 21 and upper electrode 12c are formed to constitute the capacitor Cd. Such a structure can be realized by changing the patterning manner using photolithography.

Embodiment 4

Figure 25:
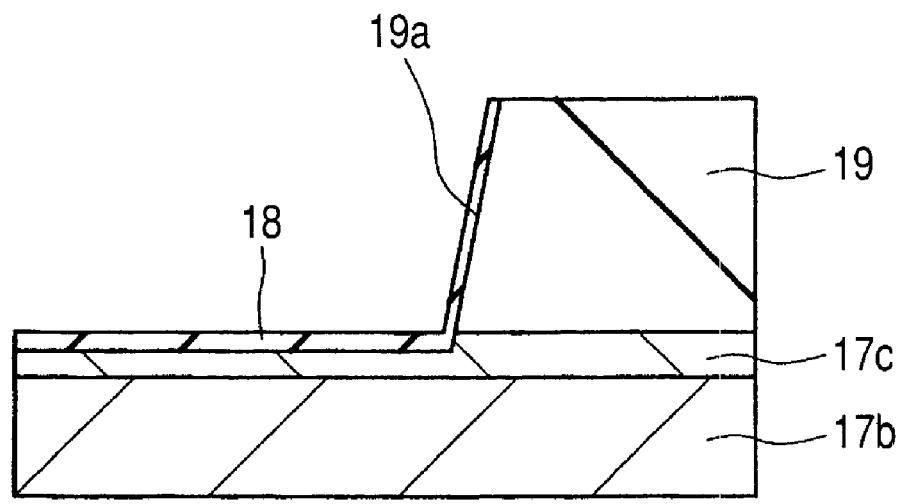
FIG. 25 is an enlarged cross-sectional view illustrating the vicinity of an opening portion of the capacitor illustrated in FIG. 3.

In Embodiment 4, a capacitor having sidewalls formed on the side surfaces of an opening portion will be explained. FIG. 25 is an enlarged cross-sectional view illustrating the vicinity of an opening portion 19a of the capacitor shown in FIG. 3. In FIG. 25, a titanium nitride film 17c is formed over an aluminum film 17b and over the titanium nitride film 17c, an insulating film 19 is formed. The insulating film 19 has the opening portion 19a formed therein and the opening portion 19a has, on the bottom surface and side surfaces thereof, a capacitor insulating film 18. Over the capacitor insulating film 18, an upper electrode 12, which is however not illustrated in this drawing, is formed.

Etching is used for the formation of the opening portion 19a in the insulating film 19. When it is formed, a portion of the titanium nitride film 17c exposed from the bottom of the opening portion 19a is removed by overetching. A capacitor insulating film 18 is then formed over the insulating film 19 including the bottom surface and side surfaces of the opening portion 19a. The capacitor insulating film 18 is formed, for example, by plasma CVD. When plasma CVD is employed, the thickness of the capacitor insulating film 18 formed over the bottom surface of the opening portion 19a is different from that of the capacitor insulating film 18 formed over the side surfaces of the opening portion 19a. In other words, the thickness of the capacitor insulating film 18 formed over the side surfaces of the opening portion 19a is smaller than that formed over the bottom surface of the opening portion 19a. Etching of the titanium nitride film 17c and the thinning phenomenon of the capacitor insulating film 18 over the side surfaces of the opening portion 19a lead to an undesirable reduction in withstand voltage of the capacitor at the corners of the opening portion 19a.

Figure 26:
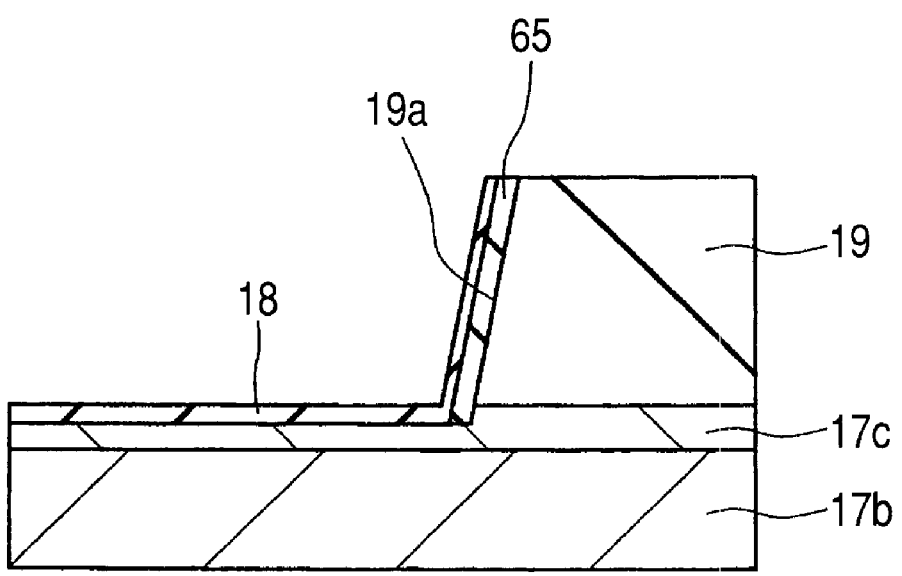
FIG. 26 is a cross-sectional view illustrating sidewalls formed on the side surfaces of the opening portion.
Figure 27:
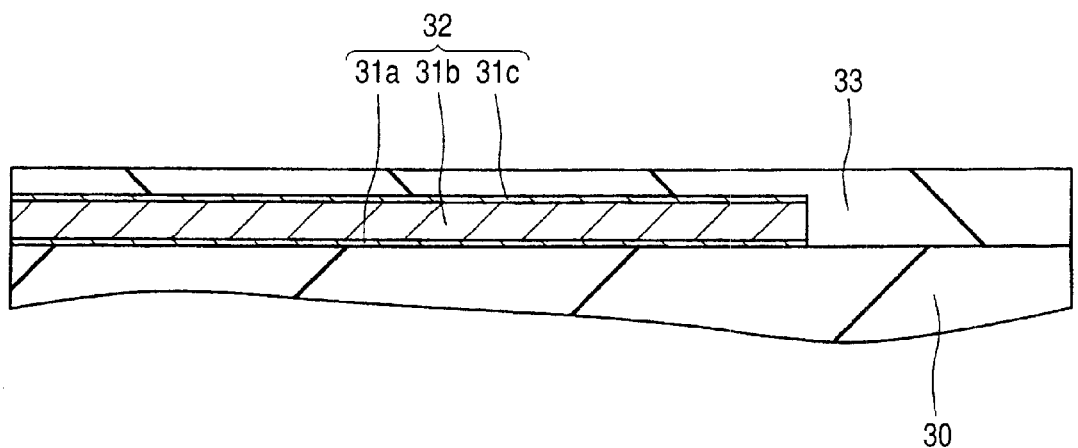
FIG. 27 is a cross-sectional view illustrating a manufacturing step of a capacitor of Embodiment 4.

In this Embodiment 4, as illustrated in FIG. 26, sidewalls 65 made of an insulator film are provided over the side surfaces of the opening portion 19a. By forming the capacitor insulating film 18 over these sidewalls 65, a desired thickness of the insulating film can be maintained at the corners of the opening portion 19a and therefore the capacitor has an improved withstand voltage. This means that since the opening portion 19a has, on the side surfaces thereof, the sidewalls 65 as well as the capacitor insulating film 18, even if a portion of the titanium nitride film 17c is removed by etching, the distance between the intermediate electrode and upper electrode at the corners of the opening portion 19a can be increased. This makes it possible to prevent leakage current at the corners of the opening portion 19a, thereby improving the withstand voltage of the capacitor.

In the next place, a manufacturing method of the capacitor in Embodiment 4 will next be explained. As illustrated in FIG.

27, a titanium nitride film 31a, aluminum film 31b and titanium nitride film 31c are successively stacked over the insulating film 30. The titanium nitride film 31a, aluminum film 31b and titanium nitride film 31c can be formed for example by sputtering. Then, by photolithography and etching, the titanium nitride film 31a, aluminum film 31b and titanium nitride film 31c are patterned, whereby a lower electrode 32 composed of the titanium nitride film 31a, aluminum film 31b and titanium nitride film 31c is formed. Over the insulating film 30 including the lower electrode 32, an insulating film 33 is formed. This insulating film 33 can be made of a silicon oxide film by using for example CVD.

Figure 28:
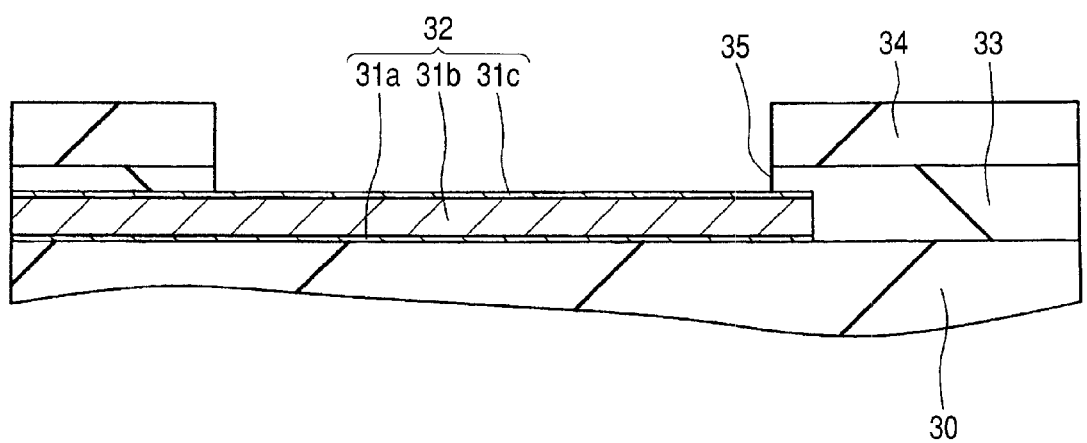
FIG. 28 is a cross-sectional view illustrating a manufacturing step of the capacitor following that of FIG. 27.

As illustrated in FIG. 28, after application of a resist film 34 onto the insulating film 33, the resist film 34 is subjected to exposure and development to pattern the resist film 34. This patterning is carried out so as not to leave the resist film 34 in a formation region of an opening 35. With the patterned resist film 34 as a mask, the insulating film 33 is etched, whereby the opening portion 35 is formed in the insulating film 33. From the bottom of this opening portion 35, the lower electrode 32 is exposed.

Figure 29:
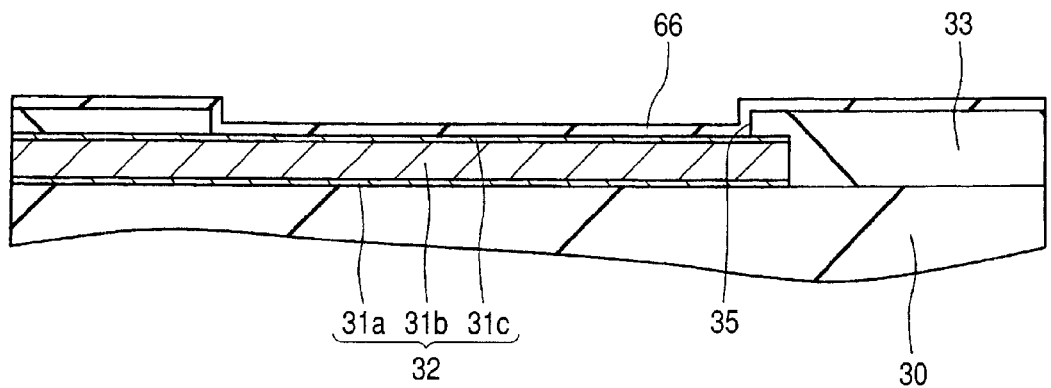
FIG. 29 is a cross-sectional view illustrating a manufacturing step of the capacitor following that of FIG. 28.
Figure 30:
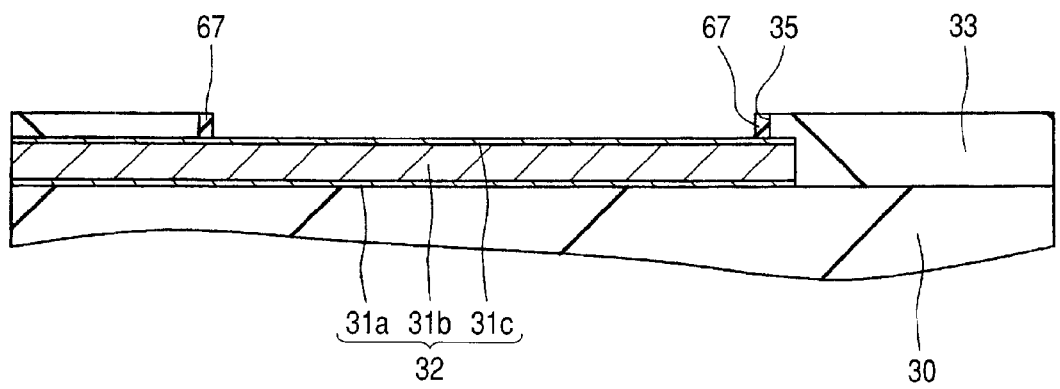
FIG. 30 is a cross-sectional view illustrating a manufacturing step of the capacitor following that of FIG. 29.

As illustrated in FIG. 29, an insulating film (third insulating film) 66 made of for example a silicon oxide film is formed over the insulating film 33 including the inside of the opening portion 35. The insulating film 66 can be formed for example by CVD. As illustrated in FIG. 30, the insulating film 66 is anisotropically etched to leave the insulating film 66 only over the side surfaces of the opening portion 35, whereby sidewalls 67 are formed. The sidewalls 67 may be made of not only a silicon oxide film but also another insulating film insofar as it has an adequate etching selectivity relative to the titanium nitride film 31c which lies under the sidewalls.

Figure 31:
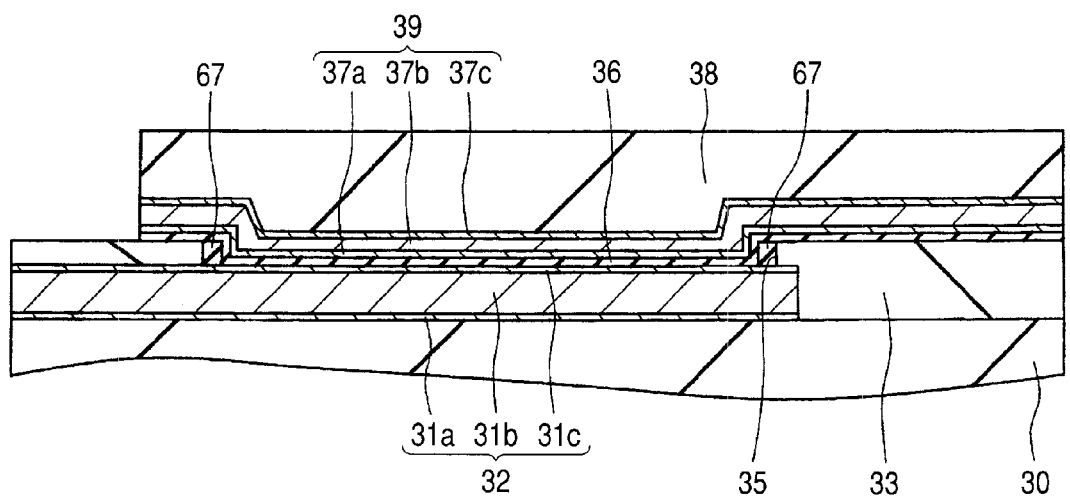
FIG. 31 is a cross-sectional view illustrating a manufacturing step of the capacitor following that of FIG. 30.

As illustrated in FIG. 31, after removal of the resist film 34, a capacitor insulating film 36 is formed over the insulating film including the inside of the opening portion 35. The capacitor insulating film 36 can be formed, for example by CVD. A titanium nitride film 37a, aluminum film 37b and titanium nitride film 37c are successively formed over the capacitor insulating film 36 by sputtering. A resist film 38 is then applied to the titanium nitride film 37c and the resulting resist film 38 is subjected to exposure and development to pattern the resist film 38. This patterning is carried out so as to leave the resist film 38 in the formation region of an intermediate electrode. By etching with the patterned resist film 38 as a mask, an intermediate electrode 39 is formed.

Figure 32:
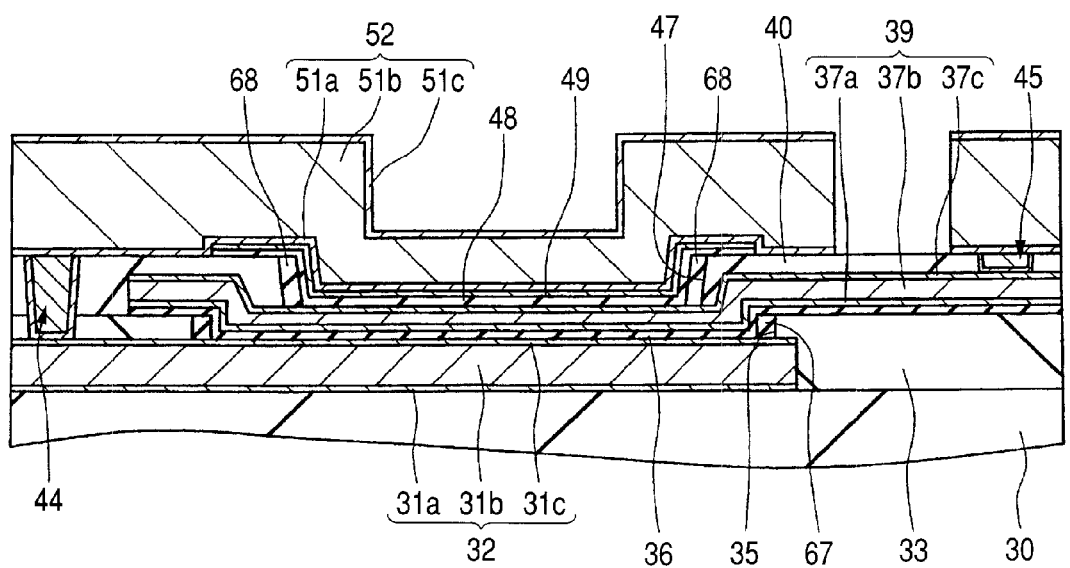
FIG. 32 is a cross-sectional view illustrating a manufacturing step of the capacitor following that of FIG. 31.

After removal of the resist film 38, an insulating film 40 is formed over the insulating film 33 including the upper surface of the intermediate electrode 39 and an opening portion 47 is made in this insulating film 40. After formation of an insulating film over the insulating film 40 including the inside of the opening portion 47, the insulating film is anisotropically etched to form sidewalls 68. Subsequent steps are carried out in a similar manner to that employed in Embodiment 1, whereby a capacitor as illustrated in FIG. 32 can be formed.

Figure 33:
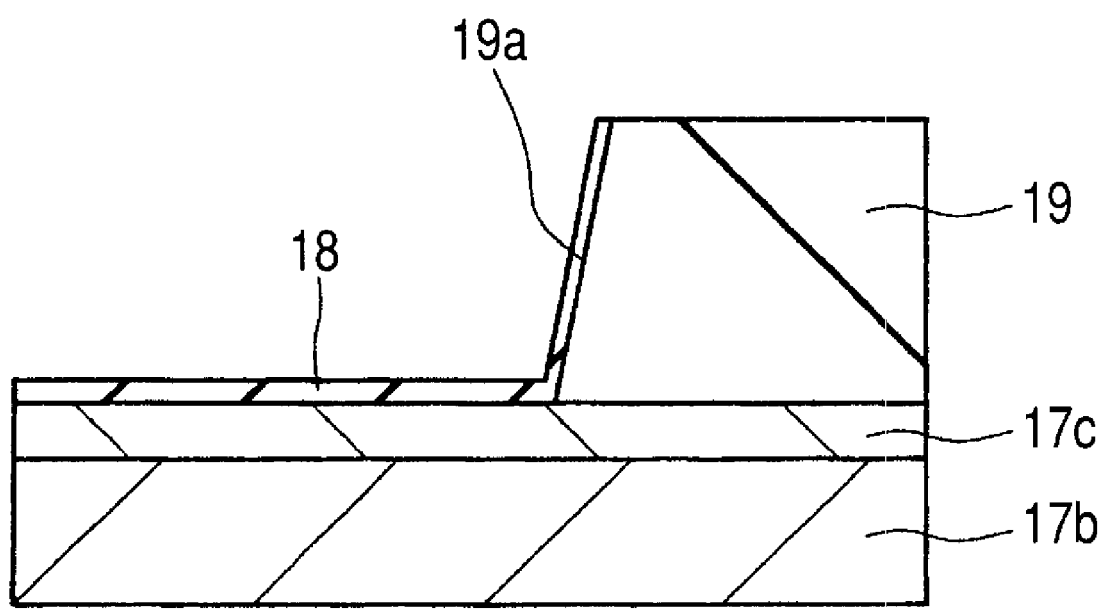
FIG. 33 is a cross-sectional view illustrating the un-overetched bottom of the opening portion.

According to Embodiment 4, a parasitic capacitance between electrodes can be reduced and in addition, by the formation of sidewalls 67 and 68, withstand voltage of a capacitor can be improved. In this Embodiment 4, the withstand voltage of the capacitor is improved by the formation of sidewalls 67 and 68. Alternatively, as illustrated in FIG. 33, the withstand voltage at the corners of the opening portion 19a may be improved by improving the etching technology, thereby suppressing an etched amount of the titanium nitride film 17c. This means that when the etched amount of the titanium nitride film 17c is suppressed, the upper electrode and intermediate electrode have an adequate distance at the corners of the opening portion 19a, making it possible to prevent leakage current and improve the withstand voltage of the capacitor.

Embodiment 5

Figure 34:
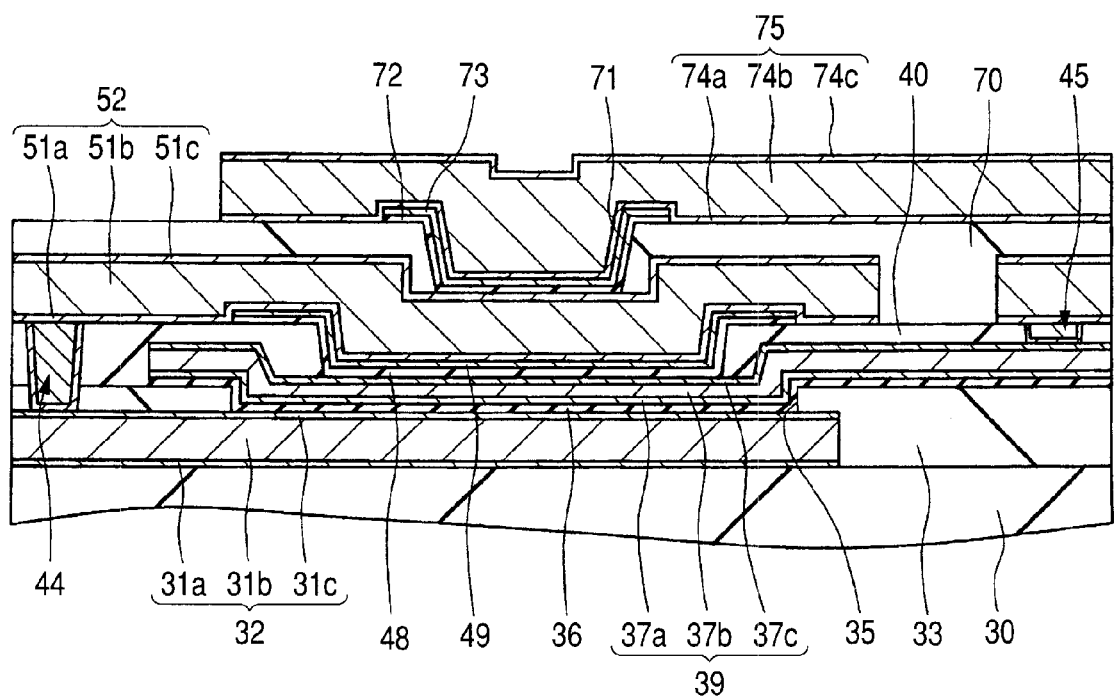
FIG. 34 is a cross-sectional view illustrating a capacitor of Embodiment 5.

In Embodiment 5, a stacked structure of three capacitors will be described. FIG. 34 is a cross-sectional view illustrating the capacitors of Embodiment 5. In FIG. 34, a structure from the lower electrode 32 to the upper electrode 52 in which two capacitors (first capacitor and second capacitor) have been stacked is similar to that of Embodiment 1. In Embodiment 5, an insulating film 70 is formed over the upper electrode 52 and an opening portion 71 is made in this insulating film 70. Over the insulating film 70 including the inside of the opening portion 71, a capacitor insulating film 72, a titanium nitride film 73 and uppermost electrode 75 are formed. The uppermost electrode 75 is made of a film stack of, for example, a titanium nitride film 74a, aluminum film 74b and titanium nitride film 74c.

In this Embodiment 5, the second capacitor composed of the intermediate electrode 39, the capacitor insulating film 48 and the upper electrode 52 is formed over the first capacitor composed of the lower electrode 32, capacitor insulating film 36 and intermediate electrode 39. Moreover, a third capacitor composed of the upper electrode 52, capacitor insulating film 72 and uppermost electrode 75 is formed over the second capacitor. These first capacitor, second capacitor and third capacitor are stacked one after another and they are connected in parallel. According to Embodiment 5, a large capacitance can be ensured while reducing the space occupied by the capacitors. In short, a greater capacitance can be ensured by the stacked structure of three capacitors in Embodiment 5 compared with the stacked structure of two capacitors.

Embodiment 6

Figure 35:
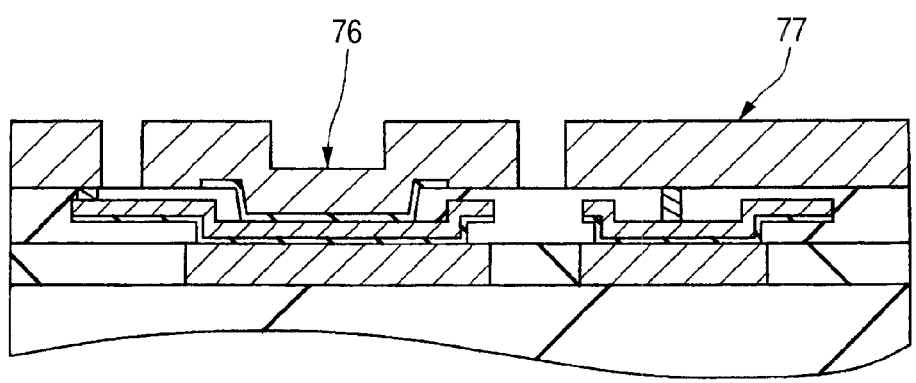
FIG. 35 is a cross-sectional view illustrating a capacitor of Embodiment 6.

In Embodiment 6, an example in which a capacitor having a stacked structure two sub-capacitors and a capacitor having no stacked structure are provided will be described. FIG. 35 is a cross-sectional view illustrating these capacitors in Embodiment 6. As illustrated in FIG. 35, in Embodiment 6, a capacitor 76 obtained by stacking two sub-capacitors and a capacitor 77 (fourth capacitor) having a single layer structure are provided. The capacitor 76 is similar to that described in Embodiment 1. The capacitor 76 and the capacitor 77 are connected in parallel and the capacitor 77 has a switch for turning it on or off. Such a structure enables fine adjustment of the capacitance. Described specifically, the capacitor 76 has a large capacitance because it has a stacked structure. The capacitor 77 has a small capacitance because it has a single-layer structure. When the switch connected to the capacitor 77 is turned on, the capacitance of the capacitor 77 is added to that of the capacitor 76. When addition of only small capacitance to the capacitance of the capacitor 76 is required because of the characteristics of a circuit or the like, it is satisfied by turning on the switch connected to the low-capacitance capacitor 77. According to Embodiment 6, fine adjustment of capacitance can be accomplished by using the capacitor 76 having a stacked structure and the capacitor 77 having a single-layer structure.

Embodiment 7

Figure 36:
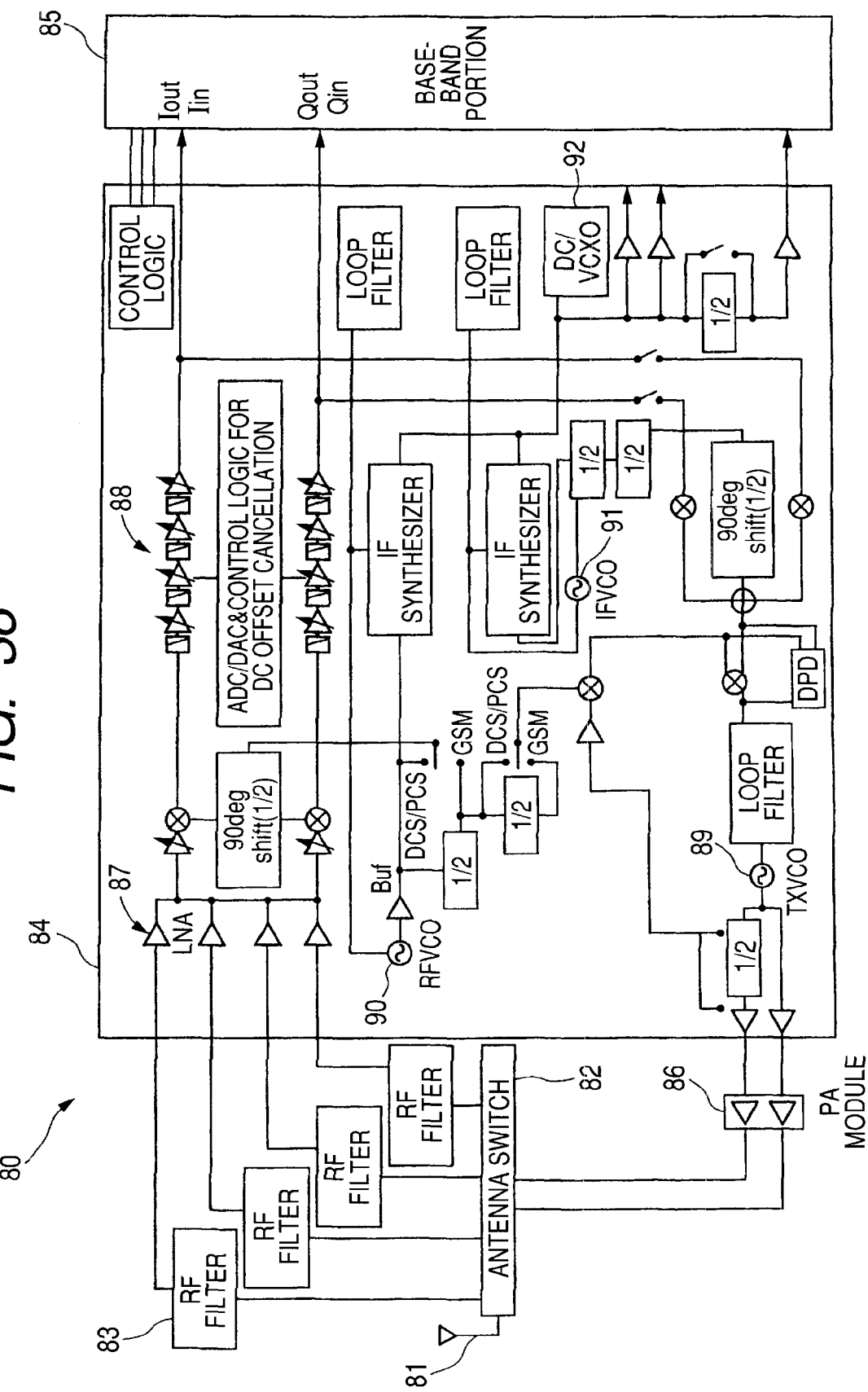
FIG. 36 is a block diagram illustrating a transmitter and receiver portion of a cellular phone.

In Embodiment 7, an electronic apparatus using the capacitor as described in Embodiments 1 to 6 will be described. A cellular phone will be described as one example of electronic apparatuses. FIG. 36 is a block diagram illustrating the constitution of a transmitter and receiver portion of a cellular phone. As illustrated in FIG. 36, the transmitter and receiver portion 80 is equipped with an antenna 81, antenna switch 82, RF (Radio Frequency) filter 83, RF-IC (transmitter and receiver device) 84, baseband portion 85 and PA module 86.

Further, the RF-IC 84 has an LNA (Low Noise Amplifier) 87, PGA 88, TXVCO (voltage controlled oscillator) 89, RFVCO 90, IFVCO 91, DC/VCXO 92 and the like.

One example of the radio-wave receiving behavior of the cellular phone will next be described briefly. RF signals received by the antenna 81 are transmitted to the receiver side by the antenna switch 82. The RF signals thus received are input into the RF-IC 84 via the RF filter 83. The RF signals thus input into the RF-IC 84 are amplified by the LNA 87. Then, the amplified signals are subjected to orthogonal demodulation in a direct conversion mixer, whereby baseband signals can be obtained directly. By the gain control in the PGA 88, respective baseband signals are sent to the baseband portion 85 in which they are treated. In such a manner, radio waves can be received.

On example of the radio-wave transmitting behavior of the cellular phone will next be described briefly. When baseband signals are input to the RF-IC 84 from the baseband portion 85, orthogonal modulation of IF signals with baseband signals is carried out at the RF-IC 84. In a PLL circuit including the TXVCO 89, IF signals are frequency-converted to RF signals. The synthesizer of the RF-IC 84 supplies local signals to each block via the built-in RFVCO 90, IFVCO 91 or frequency divider. A reference clock is generated using the DC/VCXO 92. The RF signals generated by the RF-IC 84 are amplified by the PA module 86. Via the antenna switch 82, the RF signals are transmitted from the antenna 81. In such a manner, radio waves can be transmitted.

Figure 37:
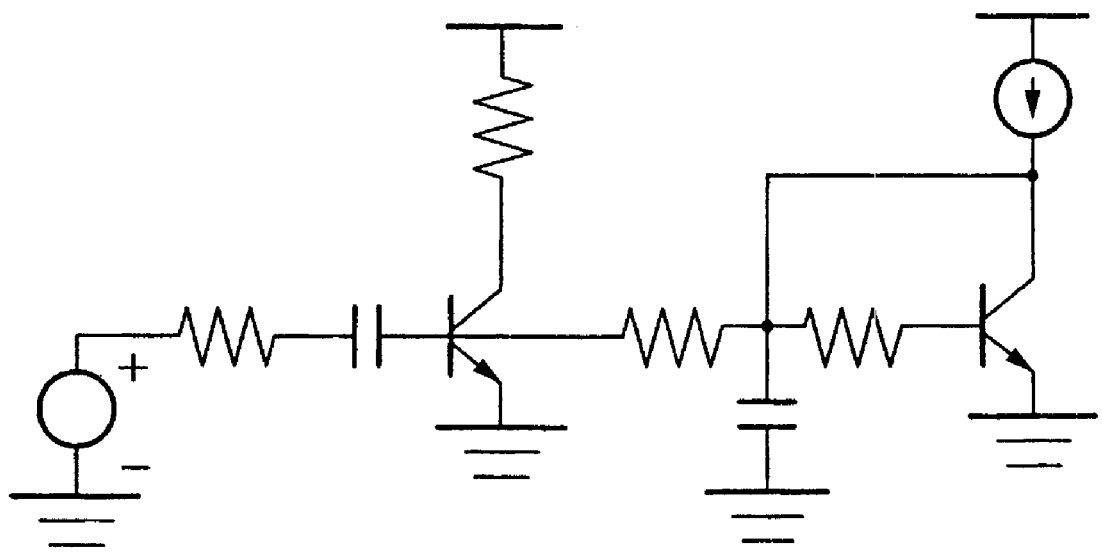
FIG. 37 is a circuit diagram illustrating one example of a low-noise amplifier.

The RF-IC 84 includes a variety of circuits as illustrated in FIG. 36. These circuits are mounted on one semiconductor chip. In other words, an RF-IC is formed over one semiconductor chip. FIG. 37 illustrates one example of the circuit of the LNA 87. As can be found from FIG. 37, plural capacitors are used for the LNA 87. The LNA 87 is a low-noise amplifier and the capacitor disposed at the input portion of this LNA 87 is used for impedance matching.

Figure 38:
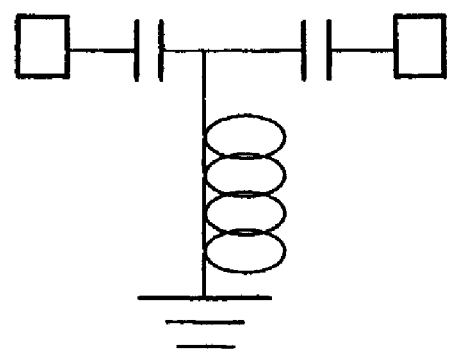
FIG. 38 is a circuit diagram illustrating one example of a bandpass filter.

FIG. 38 illustrates one example of a bandpass filter included in the PGA 88. The bandpass filter illustrated in FIG. 38 has a function of allowing only signals having a frequency within a specific range to pass therethrough. From the diagram, it has been found that plural capacitors are used for it.

Figure 39:
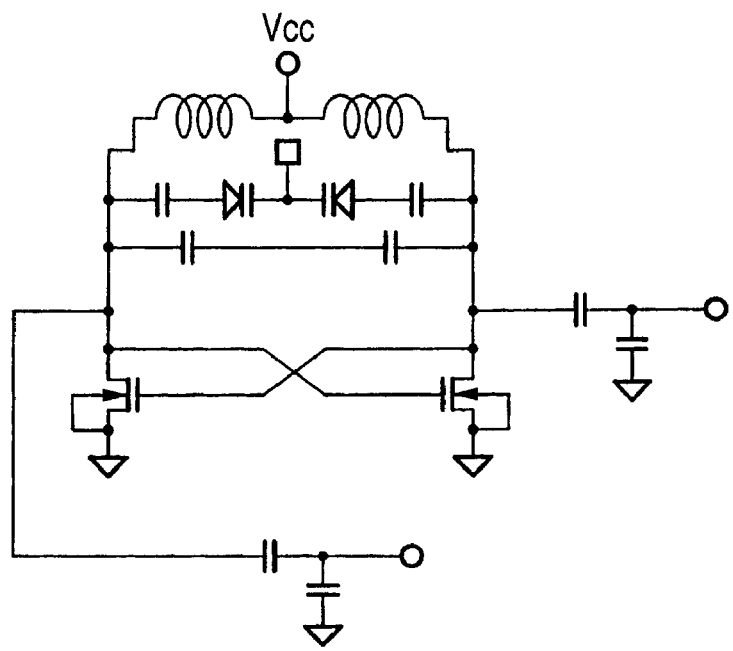
FIG. 39 is a circuit diagram illustrating one example of a voltage controlled oscillator.
Figure 40:
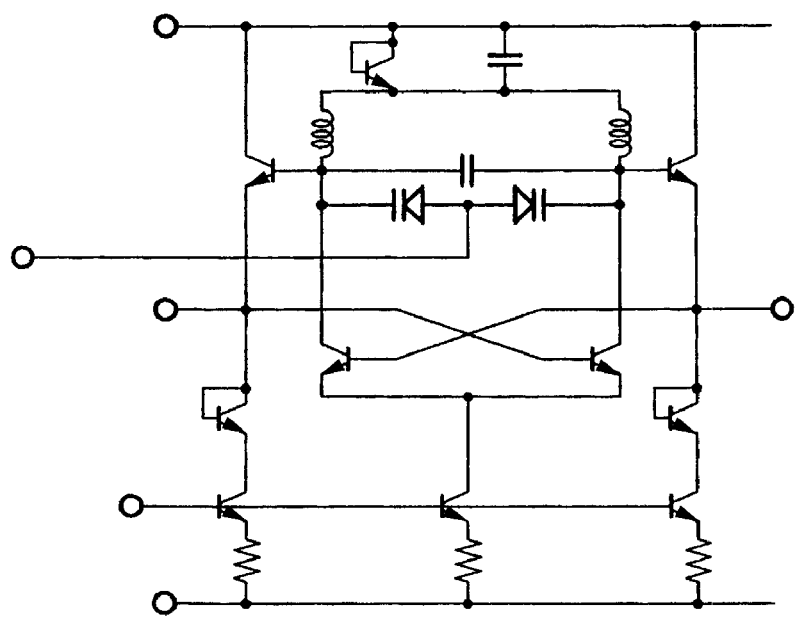
FIG. 40 is a circuit diagram illustrating another example of a voltage controlled oscillator.

FIGS. 39 and 40 each illustrates one example of a voltage controlled oscillator. The voltage controlled oscillator illustrated in FIG. 39 or 40 is a differential type oscillator composed of an amplifier circuit for applying a negative resistance and LC resonance circuit. The diagram shows that plural capacitors are used for it. Thus, plural capacitors are used for the circuits formed in the RF-IC 84. These capacitors are required to be low-loss ones having less parasitic resistance or parasitic capacitance in consideration of their high frequency characteristics and noise characteristics. By using the capacitors as described above in Embodiments 1 to 6 having reduced parasitic capacitance, low-loss and high-performance capacitors can be provided for the RF-IC 84.

Each circuit of the RF-IC 84 uses many capacitors, for example, as illustrated in FIGS. 37 to 40. The total capacitance of these capacitors of the RF-IC is around 10 nF. When this capacitance is made up of gate capacitance (diffusion capacitance), an area of about 2.5 mm$^2$ is necessary. Here, the unit capacitance of the gate capacitance is set at, for example, 4 fF/μm$^2$.

The RF-IC 84 is usually composed of a three-layer to six-layer multilevel interconnect but the area used for the interconnect is from 20% to 40% per layer at present, suggesting that there remains a large unused area. By using the capacitors as described in Embodiments 1 to 6 for the RF-IC 84 and efficiently disposing them in a multi-level interconnect, the area of the formation region of the gate capacitance can be reduced. For example, in the case of a 3.5 mm×3.5 mm semiconductor chip, when a portion corresponding to the gate capacitance of 2.5 mm$^2$ is formed between interconnects, the necessary size of the semiconductor chip becomes 3.5 mm×3.5 mm−2.5 mm$^2$=9.75 mm$^2$ and the area can be reduced by about 20%. As a result, the number of semiconductor chips available from one silicon wafer can be increased by about 20%, leading to a reduction of a production cost per semiconductor chip.

Here, the supply voltage of the RF-IC 84 can hardly be reduced so that each capacitor must have certain breakdown voltage. As described above in Embodiment 4, the withstand voltage of the capacitor can be improved by forming sidewalls. Accordingly, use of the capacitor as described in Embodiment 4 for the RF-IC 84 can improve the withstand voltage, leading to improvement of the reliability of the RF-IC 84.

In Embodiment 7, an example of applying the capacitor as described in Embodiments 1 to 6 to the RF-IC 84 was described. They may be applied not only to it, but also to, for example, the PA module 86.

The present invention made by the present inventors was described specifically based on some embodiments. The present invention is however not limited to them, but it is needless to say that changes may be made without departing from the scope of the present invention.

The present invention can be used widely in the manufacture of semiconductor devices.

The invention claimed is:

1. A semiconductor device including a capacitor, comprising:
    a lower electrode of the capacitor made of a metal film;
    a first interlayer insulating film having a first opening portion and formed over the lower electrode, a top surface of the lower electrode being exposed from the first interlayer insulating film through the first opening portion, and the lower electrode being partially covered by the first interlayer insulating film;
    a first sidewall made of a first insulating film and formed over a side surface of the first opening portion;
    a first capacitor insulating film of the capacitor formed over the first interlayer insulating film and inside the first opening portion, wherein the first sidewall is formed between the first capacitor insulating film and the first interlayer insulating film, and wherein, in the first opening portion, the first capacitor insulating film is directly formed on the lower electrode and the first side wall;
    an intermediate electrode of the capacitor formed over the first capacitor insulating film;
    a second interlayer insulating film having a second opening portion and formed over the intermediate electrode, a top surface of said intermediate electrode being exposed from the second interlayer insulating film through the second opening portion;
    a second sidewall made of a second insulating film and formed over a side surface of the second opening portion;
    a second capacitor insulating film of the capacitor formed over the second interlayer insulating film and inside the second opening portion, wherein the second sidewall is formed between the second capacitor insulating film and the second interlayer insulating film, and wherein, in the second opening portion, the second capacitor insulating film is directly formed on the intermediate electrode and the second side wall; and an upper electrode of the capacitor formed over the second capacitor insulating film.

2. A semiconductor device according to the claim 1,
wherein a thickness of the first capacitor insulating film formed on the side surface of the first opening portion is thinner than a thickness of the first capacitor insulating film formed on the bottom of the first opening portion.

3. A semiconductor device according to the claim 2,
wherein a thickness of the second capacitor insulating film formed on the side surface of the second opening portion is thinner than a thickness of the second capacitor insulating film formed on the bottom of the second opening portion.

4. A semiconductor device according to the claim 1,
wherein the intermediate electrode is formed inside and outside of the first opening portion.

5. A semiconductor device according to the claim 1,
wherein the upper electrode is formed inside and outside of the second opening portion.

6. A semiconductor device according to the claim 1,
wherein the planer size of the first opening portion is larger than the planer size of the second opening portion.

7. A semiconductor device according to the claim 1,
wherein the capacitor is consisted of a first capacitor and a second capacitor, and
wherein the first capacitor is consisted of the lower electrode, the first capacitor insulating film and the intermediate electrode,
wherein the second capacitor is consisted of the intermediate electrode, the second capacitor insulating film and the upper electrode, and
wherein the first and second capacitors are connected in parallel.

8. A semiconductor device according to the claim 1,
wherein the lower electrode and the upper electrode are electrically connected to same potential.

9. A semiconductor device according to the claim 1,
wherein the first insulating film of the first sidewall is made of a silicon oxide.

10. A semiconductor device according to the claim 1,
wherein the lower electrode, the intermediate electrode and the upper electrode are made of a metal film.

* * * * *